(12) United States Patent
Beckhoff et al.

(10) Patent No.: US 12,245,398 B2
(45) Date of Patent: Mar. 4, 2025

(54) CONTROL-CABINET SYSTEM HAVING A BASE MODULE AND A FUNCTIONAL MODULE, BASE MODULE AND FUNCTIONAL MODULE

(71) Applicant: Beckhoff Automation GmbH, Verl (DE)

(72) Inventors: Hans Beckhoff, Verl (DE); Peter Wittenborg, Verl (DE); Daniel Siegenbrink, Bielefeld (DE)

(73) Assignee: Beckhoff Automation GmbH, Verl (DE)

( * ) Notice: Subject to any disclaimer, the term of this patent is extended or adjusted under 35 U.S.C. 154(b) by 266 days.

(21) Appl. No.: 18/150,348

(22) Filed: Jan. 5, 2023

(65) Prior Publication Data
US 2023/0142990 A1   May 11, 2023

Related U.S. Application Data

(63) Continuation of application No. PCT/EP2021/071772, filed on Aug. 4, 2021.

(30) Foreign Application Priority Data

Aug. 7, 2020  (DE) ..................... 10 2020 120 918.5

(51) Int. Cl.
*H05K 7/20* (2006.01)
*H05K 7/14* (2006.01)

(52) U.S. Cl.
CPC ....... *H05K 7/20209* (2013.01); *H05K 7/1465* (2013.01); *H05K 7/20409* (2013.01)

(58) Field of Classification Search
CPC ............... H05K 7/20145; H05K 7/202; H05K 7/20409; H05K 7/206; H05K 7/20609; H05K 7/1465; H02B 1/56–565
See application file for complete search history.

(56) References Cited

U.S. PATENT DOCUMENTS 5,006,959 A      4/1991  Freige et al.
9,795,063 B1 *  10/2017  Klein ...................... F16K 3/03
(Continued)

FOREIGN PATENT DOCUMENTS

DE   102014104857 A1   10/2015
DE   102018133646 A1   7/2020
(Continued)

OTHER PUBLICATIONS

"EtherCAT—The Ethernet Fieldbus," EtherCAT Technology Group, Mar. 2020, 25 pages.
(Continued)

*Primary Examiner* — Robert J Hoffberg
(74) *Attorney, Agent, or Firm* — Dorsey & Whitney LLP

(57) ABSTRACT

A control-cabinet system has a base module and at least one functional module. The base module has a base housing with a first housing face and a second housing face. The functional module has a functional housing with a housing underside, where a circulation channel is arranged. Air flow may be circulated in the circulation channel, where each base connection element comprises circulation openings which are fluidically connected to the circulation channel. The functional connection element comprises coupling openings fluidically connected to an interior of the functional housing. The coupling openings are coupleable to the circulation openings, in which a fluidic connection exists between the circulation channel and the interior of the functional housing. A fluidically closed circulation circuit comprising the circulation channel and the interior of the functional housing is formed, in which air flow may be circulated.

20 Claims, 16 Drawing Sheets

(56) References Cited

U.S. PATENT DOCUMENTS

| | | | | |
|---|---|---|---|---|
| 11,490,538 B2* | 11/2022 | Beckhoff | ............ | H05K 7/1477 |
| 11,533,820 B2* | 12/2022 | Beckhoff | ............ | H05K 7/1468 |
| 11,540,413 B2* | 12/2022 | Siegenbrink | ......... | H05K 7/1452 |
| 11,956,915 B2* | 4/2024 | Beckhoff | ............ | H05K 9/0015 |
| 2019/0029132 A1 | 1/2019 | Haba et al. | | |

FOREIGN PATENT DOCUMENTS

| | | | | |
|---|---|---|---|---|
| DE | 102018133647 A1 | 7/2020 | | |
| DE | 102018133657 A1 | 7/2020 | | |
| EP | 1093199 A1 * | 4/2001 | ............ | H02B 1/565 |
| WO | 0052695 A1 | 9/2000 | | |

OTHER PUBLICATIONS

Office Action dated Jun. 14, 2021 in connection with German patent application No. 10 2020 120 918.5, 13 pages including English translation.

International Search Report and Written Opinion dated Nov. 12, 2021 in connection with International Patent Application No. PCT/EP2021/071772, 25 pages including English translation.

* cited by examiner

CONTROL-CABINET SYSTEM HAVING A BASE MODULE AND A FUNCTIONAL MODULE, BASE MODULE AND FUNCTIONAL MODULE

CROSS-REFERENCE TO RELATED APPLICATIONS

This patent application is a continuation of International Patent Application No. PCT/EP2021/071772, "Control-Cabinet System Comprising a Base Module and a Functional Module, Base Module and Functional Module," filed Aug. 4, 2021, which claims the priority of German patent application DE 10 2020 120 918.5, "Schaltschranksystem mit einem Basismodul und einem Funktionsmodul, Basismodul und Funktionsmodul," filed Aug. 7, 2020, each of which is hereby incorporated by reference herein, in the entirety and for all purposes.

FIELD

The application provides a control-cabinet system with a base module and a functional module. Moreover, the application provides a base module and a functional module for a control-cabinet system.

BACKGROUND

In modular field-bus systems, which may e.g. be used in automation systems, functional modules may be connected directly to one another or each may be connected to a base module. In the latter variant, data connections and extra-low voltage connections may be provided on the base module to which the functional modules are connected. This allows a simple structure of the modular field-bus system. The functional modules may take on different functionalities and e.g. be embodied as input modules, output modules, PLC control modules, motor control modules or power supply modules. Via a field bus, or via an interface, the components of which are, in addition to the field bus for data communication, a power supply of an extra-low voltage, both a communication option and a power supply with an extra-low voltage are provided.

The disadvantage of this field-bus system is therefore that a separate mains connection must be provided for functional modules such as a motor controller, for which a higher voltage is required. This complicates the wiring and installation of such a field-bus system if the functionality of a control cabinet is to be provided by the field-bus system. A control cabinet may contain the electrical and electronic components of a process system, of a machine tool or production equipment that are not located directly in the machine.

For control-cabinet systems, in particular modular control-cabinet systems with a base module and several functional modules that may be connected to the base module, the problem of excessive heat generation of the individual electrical and electronic components of the base module or the functional modules arises. For control-cabinet systems which, due to the intended area of use, have to meet e.g. protection class IP67, and the control-cabinet systems therefore have to be dust-tight and fully protected against contact, the problem of cooling or removing the heat generated by the electrical or electronic components arises. Due to the possibly airtight or fluid-tight embodiment of the housings of the individual modules of the control-cabinet system, the use of external active cooling, in which heat generated is dissipated by the active introduction of external coolants, is technically complex, costly and associated with the use of additional components that increase the space requirements of the control-cabinet system. For many applications, such active external cooling solutions are therefore unattractive.

SUMMARY

The application provides a control-cabinet system with a base module and at least one functional module, which has an improved cooling mechanism. The application further provides a base module and a functional module for a control-cabinet system having an improved cooling mechanism.

EXAMPLES

A control-cabinet system is provided having a base module and at least one functional module. For example, the base module comprises a base housing with a first housing face and a second housing face, wherein a plurality of base connection elements with base voltage connections and base data connections are arranged at the first housing face, wherein at least one data line with a plurality of switch-on units are arranged in the base housing, which data line is connected to the base data connections of the base connection elements via the data line, and at least one voltage line which is connected to the base voltage connections of the base connection elements.

The functional module comprises a functional housing with a housing underside. For example, a functional connection element with voltage connections and data connections is arranged on the housing underside, wherein at least one electronic functional circuit which is connected to the voltage connections and the data connections of the functional connection element is arranged in the functional housing, wherein the functional module may be connected to the base module via a coupling of the functional connection element to one of the base connection elements, and a connection of the voltage connections and data connections of the functional connection element to the base voltage connections and base data connections of the base element may be achieved.

A circulation channel is arranged in the base housing. For example, an air flow may be circulated in the circulation channel, wherein each base connection element has circulation openings which are fluidically connected to the circulation channel, wherein the functional connection element has coupling openings which are fluidically connected to an interior of the functional housing, wherein the coupling openings may be coupled to the circulation openings, and wherein, in a coupling of the coupling openings with the circulation openings, a fluidic connection is provided between the circulation channel and the interior of the functional housing, and a fluidically closed circulation circuit comprising the circulation channel and the interior of the functional housing is embodied, in which an air flow may be circulated.

This achieves the technical advantage that a control-cabinet system may be provided in which electrical and electronic components of the control-cabinet system may be cooled by passive cooling. For this purpose, a base module of the control-cabinet system provides a circulation channel in which an air volume may be circulated. The base module also comprises a plurality of circulation openings that are fluidically connected to the circulation channel and are integrated into a plurality of base connection elements that are used to couple functional modules of the control-cabinet system to the base module. The functional modules of the control-cabinet system have corresponding coupling openings that are fluidically connected to an interior of a functional housing of the respective functional modules and are integrated into the respective functional connection elements of the functional modules.

Via a coupling of a functional connection element of a functional module to a corresponding base connection element of the base module, by which a connection of the functional module to the base module is achieved, a fluidic connection between the interior of the functional housing of the functional module and the circulation channel of the base module may be achieved via a coupling of the coupling openings of the functional connection element of the functional module to the circulation openings of the corresponding base connection element of the base module. Via the fluidic connection between the interior of the functional housing of the functional module and the circulation channel of the base module, an exchange of air within the functional housing of the functional module and the air volume within the circulation channel of the base module may thus be achieved. Via the fluidic connection between the interior of the functional housing of the functional module and the circulation channel of the base module, a self-contained circulation circuit may thus be established, which is formed by the interior of the functional housing of the functional module and the circulation channel, and in which a circulation of the air volume contained therein or a circulating air flow may be generated.

By circulating the air volume within or along the circulation circuit, heat generated by the operation of an electronic functional circuit arranged within the functional housing of the functional module may thus be removed and a cooling effect of the functional circuit may thus be achieved. In particular, the circulation of the air volume inside the functional housing may prevent the formation of heat accumulation pockets inside the functional housing.

DETAILED DESCRIPTION

Figure 1:
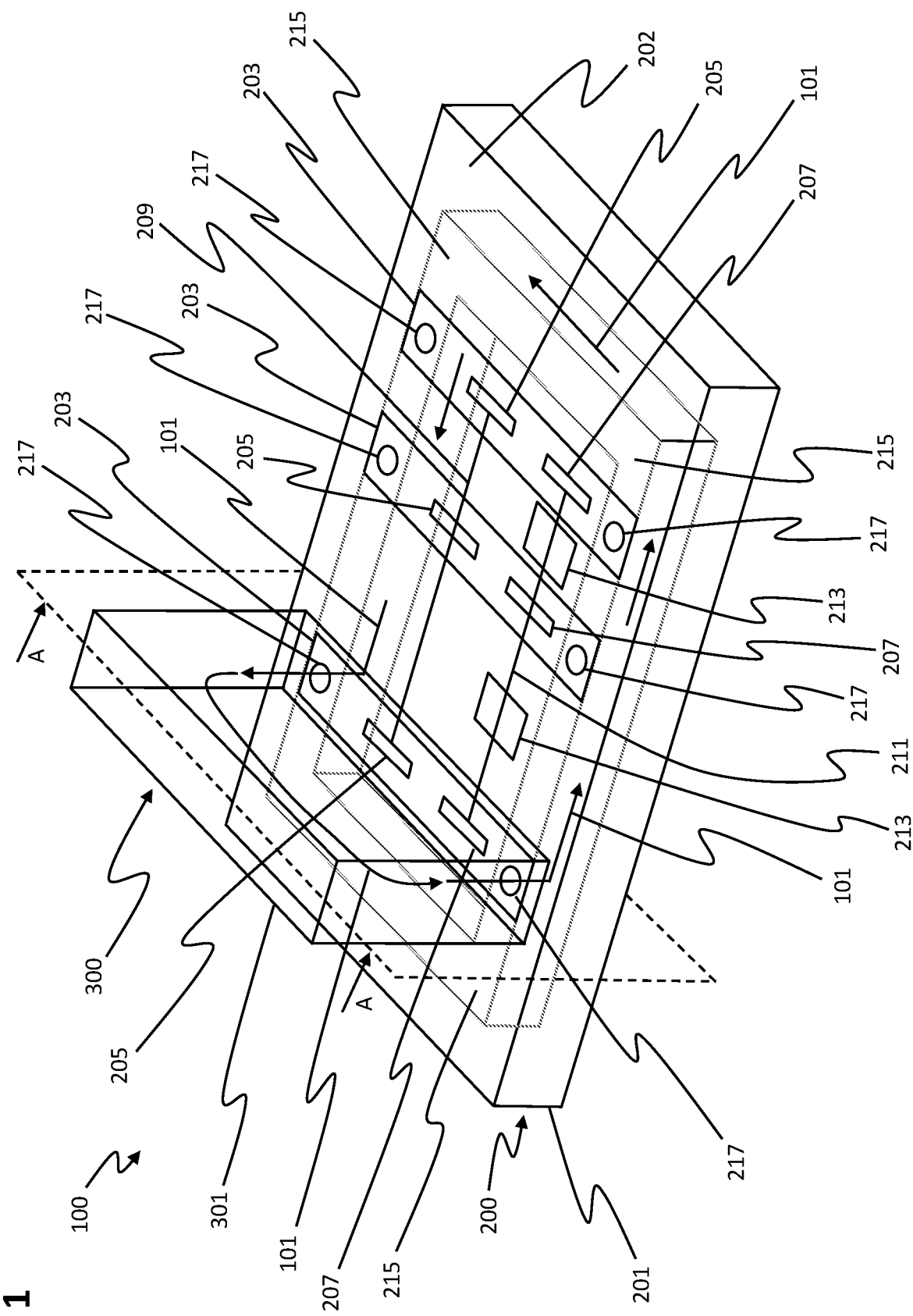
FIG. 1 is a perspective schematic view of a control-cabinet system according to an embodiment.

Heat pockets here describe the heating of an air volume surrounding a component or components of the electronic functional circuit, which leads to a substantial and highly localized increase in temperature of the air volume surrounding the respective part or component due to inadequate mixing of the heated air volume with further air volume within the functional housing. This may result in excessive heating of the respective components of the functional circuit and, consequently, damage to the components. The air circulation within the functional housing may swirl these heat accumulation pockets and thus prevent excessive heating of the air volume surrounding the functional circuit. Thus, passive cooling of the functional circuit or the components and parts of the functional circuit may be achieved.

In addition, the circulation circuit represents a self-contained circuit in which an exchange of air volume within the circulation circuit with ambient air surrounding the control-cabinet system is avoided. Thus, passive cooling of the components and parts of the functional module of the control-cabinet system may be achieved and dust-tightness or fluid-tightness of the control-cabinet system may be ensured.

By integrating the circulation openings, which are fluidically connected to the circulation channel, into the base connection elements of the base module, or by integrating the coupling openings, which are fluidically connected to the interior of the functional housing of the functional module, into the functional connection elements of the functional module, it may be achieved that by connecting a functional module to the base module, a coupling of the functional module to the circulation circuit of the control-cabinet system is automatically achieved by coupling the functional connection elements of the functional module to corresponding base connection elements of the base module. A functional module connected to the base module of the control-cabinet system is thus automatically integrated into the circulation circuit and participates in passive cooling through air circulation within the circulation circuit, which provides air circulation inside the functional housing of the respective functional module. An additional connection of the respective functional module to an additional cooling system is therefore not necessary.

In addition, a plurality of functional modules may be integrated into the circulation circuit via the plurality of base connection elements and the circulation openings integrated therein and thus participate in the air circulation within the circulation circuit and the associated cooling.

The functional circuits within the functional modules or the corresponding base voltage connections or base data connections within the base module may be used to provide the usual functionality of a control-cabinet system.

The voltage line may comprise an extra-low voltage line and a low-voltage line. The voltage connections may accordingly comprise extra-low-voltage connections and low-voltage connections.

In this context, extra-low voltages are understood to be electrical voltages up to 50 volts AC and/or 120 volts DC, in particular up to 25 volts AC and/or 60 volts DC. This definition of extra-low voltage may be taken from the IEC60449 standard. Low voltages are understood to be electrical voltages above the extra-low voltage range and up to 1000 volts AC and/or 1500 volts DC. Furthermore, a supply voltage for communication electronics may be provided via the data line. This supply voltage may be in the range of a few volts.

A maximum amperage that may be provided through the extra-low voltage connections may be 40 amps. A maximum amperage that may be provided through the low voltage connections may be 75 amps.

The low-voltage line and low-voltage connections may provide a low voltage for the functional modules.

The data connections may be used to provide a field bus that may serve for communication between the base module and the functional modules. The field bus may be embodied as a field bus defined in the IEC 61158 standard, in particular as EtherCAT.

The switch-on units, which may also be referred to as slaves, are connected to one another by the data bus and form a communication network in the control-cabinet system. The switch-on units may therefore exchange data with one another. Communication or data exchange between the base module and functional modules may also take place via the switch-on units connected to the connection elements. All switch-on units are arranged in the base module. This gives the base module the advantage that, in the event of a defect or replacement of a functional module, all functional modules that are still intact may be addressed via the data bus. For this reason, moreover, a functional module may be replaced during operation of an automation system. In addition, an automation system does not have to be initialized when a configured functional module that replaces a functional module is connected to the base module. If the automation system is e.g. used in a production machine, this may prevent an undesired production stoppage.

This means that the functionalities that are traditionally provided by a control cabinet may be provided by such a basic module and associated functional modules. Further advantages are the reduced wiring effort and the simpler planning or conceptual design of such a control-cabinet system.

The base housing or the functional housing may be embodied as a bar-pressed profile or as a die-cast housing. The housing material may be metals such as aluminum, steel, stainless steel or zinc, and the housing may also be coated.

The base housing or the functional housing may consist of a plurality of individual components that are connected to one another with the aid of fastening elements, such as screws, or by welding or soldering. Furthermore, a seal may be provided between the individual components to make the base housing or the functional housing inaccessible to liquids and/or dust between the individual components.

The data line, the extra-low voltage line and the low voltage line may be arranged within the base housing on one or a plurality of circuit boards. Particularly, one circuit board may be provided for the data line and the extra-low voltage line and another circuit board for the low voltage line. The data line may comprise multiple cores. The extra-low voltage line may comprise a plurality of cores. The low voltage line may comprise a plurality of cores. If the data line, the extra-low-voltage line or the low-voltage line is arranged on a circuit board, the cores may be embodied as conductor tracks on the respective circuit board.

The base voltage connections or the base data connections of the base module or the functional module may be embodied as plug connectors and corresponding sockets. Alternatively, the connection elements may have a cable entry and a terminal connection.

With the aid of a plurality of functional modules, the functionality of a control cabinet may be provided, wherein the functional modules are not directly connected to one another, but a connection of the functional modules is provided via the base module.

The functional modules within the control-cabinet system may be embodied as input modules for reading sensor data, as output modules for outputting voltages, as PLC control modules, as motor control modules, as power supply modules and/or as feed-in modules. A feed-in module may take over the task of providing data, in particular in the form of a field bus for the base module and/or serve to supply the base module with an extra-low voltage and/or a low voltage. Furthermore, computer modules, network switch modules, servo control modules, mains filter modules, contactor modules, bus coupler modules, active or passive power factor correction modules and/or frequency converter modules or a combination of the modules mentioned may be embodied as functional modules.

In addition, it may also be provided to fit a seal between the base module and the functional modules in order to protect the system of base modules and functional modules against dust and liquids. Protection against contact may already be provided by attaching the functional modules to the base module. In order to perform the various tasks, it may be provided that the module housing has further connection elements on one of the further module housing faces, which are e.g. connected to sensors, actuators or other elements typically controlled by a control cabinet.

A base module for a control-cabinet system is provided, wherein the base module comprises a base housing having a first housing face and a second housing face, wherein a plurality of base connection elements having base voltage connections and base data connections are arranged on the first housing face, wherein at least one data line with a plurality of switch-on units, which is connected to the base data connections of the base connection elements, and at least one voltage line, which is connected to the base voltage connections of the base connection elements, are arranged in the base housing, wherein a circulation channel is arranged in the base housing, wherein an air flow may be circulated in the circulation channel, wherein each base connection element has circulation openings, wherein the circulation openings are fluidically connected to the circulation channel, wherein the circulation openings may be coupled to coupling openings of a functional module of the control-cabinet system and wherein in a coupling of the circulation openings with coupling openings of a functional module a fluidic connection between the circulation channel and an interior of the functional housing may be achieved and a fluidically closed circulation circuit comprising the circulation channel and the interior of the functional housing may be formed, in which an air flow may be circulated.

This achieves the technical advantage that a base module may be provided for a control-cabinet system with the above-mentioned advantages. Via the circulation channel within the base housing of the base module and the circulation openings fluidically connected to the circulation channel and integrated into the base connection elements of the base module, a circulation circuit may be created with corresponding functional modules of the control-cabinet system, by which a circulation of an air volume within the circulation channel and within a functional housing of a functional module connected to the base module and an associated passive or active cooling of the electronic or electrical components of the functional module may be achieved.

This may provide a basic module for a dust-tight and fluid-tight control-cabinet system with passive or active cooling in the form of an air flow circulating in a fluidically closed circulation circuit.

A functional module for a control-cabinet system is provided, wherein the functional module comprises a functional housing with a housing underside, wherein a functional connection element with voltage connections and data connections is arranged on the housing underside, wherein at least one electronic functional circuit is arranged in the functional housing, which is connected to the voltage connections and the data connections of the functional connection element, wherein it is possible to connect the functional module to the base module via a coupling of the functional connection element to a base connection element of a base module of the control-cabinet system, and wherein it is possible to achieve a connection of the voltage connections and data connections of the functional connection element to the base voltage connections and data connections of the base element, wherein the functional connection element has coupling openings, wherein the coupling openings are fluidically connected to an interior of the functional housing, wherein the coupling openings may be coupled to circulation openings of a base module of the control-cabinet system, and wherein in a coupling of the coupling openings with the circulation openings a fluidic connection between a circulation channel of the base module and the interior of the functional housing may be achieved and a fluidically closed circulation circuit comprising the circulation channel and the interior of the functional housing may be formed, in which an air flow may be circulated.

This achieves the technical advantage that a functional module may be provided for a control-cabinet system with the above-mentioned advantages. Via the coupling openings integrated in the functional connection elements of the functional module, which are fluidically connected to an interior of the functional housing of the functional module, a fluidic connection of the interior of the functional housing of the functional module to the circulation channel of the base module may be achieved via a coupling of the coupling openings with circulation openings of a base connection element of a base module of the control-cabinet system, and thus an integration of the interior of the functional housing of the functional module into the fluidic circulation circuit of the control-cabinet system may be achieved, whereby a circulation of the air volume inside the functional housing of the functional module may be achieved and an associated passive or active cooling of the electronic as well as electrical components of the functional module may be effected.

This may provide a functional module for a dust-tight and fluid-tight control-cabinet system with passive or active cooling in the form of an air flow circulating in a fluidically closed circulation circuit.

According to an embodiment, the control-cabinet system further comprises a fan element, wherein the fan element is integrated into the fluidic circulation circuit, and wherein the fan element is configured to accelerate the circulating air flow within the circulation circuit.

This achieves the technical advantage that the circulation of the air flow within the circulation duct may be improved. By operating a fan element arranged in the circulation circuit of the control-cabinet system, the circulation speed of the air flow circulating in the circulation circuit may be increased. Hereby, a turbulence of the air volume inside of a functional housing of a functional module of the control-cabinet system may be increased, thus improving a dispersion of possible heat accumulation nests. As a result, a closed active cooling may be achieved and the cooling effect within the control-cabinet system may be increased. Increased circulation of the air volume within the functional housing of a functional module of the control-cabinet system may prevent the formation of heat pockets or destroy formed heat pockets and transport the heat generated therein away into the circulation channel of the base module.

For the purposes of the application, a closed active cooling system is one in which no exchange of coolant takes place between the environment and the system being cooled.

According to an embodiment, the fan element is arranged in the functional housing of the functional module and/or within the circulation channel of the basic module.

This achieves the technical advantage of allowing flexibility in the embodiment of the cooling system. Depending on the requirements of the control-cabinet system, the fan element may be arranged within a functional housing of a functional module and/or within the circulation channel of the base module. In the event that a base module is with a small space requirement required due to the application, the fan element may thus be arranged in a functional housing of a functional module of the control-cabinet system. On the other hand, in the event that functional modules with the smallest possible space requirement are needed, the fan element may be arranged within the circulation channel of the basic module. Alternatively, the control-cabinet system may also be provided with a plurality of fan elements, either by arranging a plurality of fan elements within the circulation channel of the base module, or by arranging fan elements both within the circulation channel and within functional housings of one or of a plurality of functional modules of the control-cabinet system. In this way, individually designable cooling may be provided depending on the application requirements.

In particular, a movement of the circulating air flow and an associated cooling effect may be scaled as desired by a plurality of functional modules, each of which has fan elements, in that further functional modules with further fan elements may be connected to the base module when the cooling requirement increases, while these may be removed from the base module when the cooling requirement decreases. Alternatively, functional modules may also be embodied as cooling modules, wherein the cooling modules do not have a functional circuit and are only equipped with one or a plurality of fan elements. Cooling modules are thus used in the control cabinet exclusively to drive the air flow within or along the circulation circuit.

According to an embodiment, regulating devices are arranged at the circulation openings, wherein the regulating devices are configured to regulate a volume of an air flow passing through the circulation openings.

This achieves the technical advantage that a uniform connection of a plurality of functional modules to the circulation circuit may be ensured. When connecting a plurality of functional modules to a base module, each of which is connected to the circulation channel in a flow direction of the circulating air flow within the circulation channel of the base module one after the other via the corresponding connection elements and the coupling openings or circulation openings connected therein, the air flow coming from the circulation channel into the interior of a functional housing of a functional module connected to the base module may be regulated in such a way via the plurality of regulating devices arranged at the corresponding circulation openings that in the flow direction of the air flow within the circulation channel of functional modules arranged one below the other, each functional module is supplied with a sufficient air flow. Alternatively, regulation of the air flow flowing out of the functional housing into the circulation channel may also be achieved.

This ensures that for each functional module connected to the base module, an identical flow of circulating air through the respective functional housing and thus an identical cooling effect may be achieved, so that the positioning of the individual functional modules on the base module has no influence on the cooling capacity achieved within the respective functional housing of the functional module. Thus, uniform cooling may be ensured for a plurality of functional modules.

According to an embodiment, each coupling opening comprises a respective coupling collar, wherein the coupling collar surrounds the coupling opening and protrudes from the functional connection element, wherein the coupling collar may be inserted into a circulation opening and allows for a coupling between the coupling opening and the circulation opening, and wherein a fluid-tight connection between the functional module and the base module is achieved by the coupling between the coupling openings and the circulation openings.

This achieves the technical advantage that a fluid-tight connection between a functional module and the base module of the control-cabinet system may be achieved by connecting of the functional connection element to a corresponding base connection element. By inserting of the coupling collar of each coupling opening of a functional connection element of a functional module into the respective circulation openings of a base connection element of the base module, a fluid-tight connection between the coupling openings and the corresponding circulation openings of the respective connection elements may be achieved. Thus, by inserting the coupling collar into a corresponding circulation opening, fluid-tightness of the control-cabinet system may be ensured. Moreover, the coupling collars projecting from the respective functional connection element facilitate a connection of the respective functional module to the base module by inserting the respective coupling collars into the respective circulation openings of a respective base connection element.

According to an embodiment, sealing devices are arranged at the circulation openings, the sealing devices being embodied to fluidically close the circulation openings of the base connection elements to which no functional modules are connected.

This achieves the technical advantage that a fluid-tight seal is provided between the circulation channel of the base module and the ambient air surrounding the control-cabinet system. The circulation openings, to which no coupling openings of a functional module are connected, may be sealed against the ambient air of the control-cabinet system in a fluid-tight manner via the sealing devices arranged at the circulation openings of the base connection elements of the base module. This makes it possible to ensure that the circulation channel is sealed in a fluid-tight manner with respect to the ambient air surrounding the control-cabinet system even if all the base connection elements of the base module are not fully occupied by corresponding functional modules.

According to an embodiment, guiding devices are arranged inside of the functional housing of the functional module, wherein the guiding devices are configured to guide an air flow flowing through the coupling openings into the interior of the functional housing into a predetermined area inside of the functional housing.

Hereby, the technical advantage is achieved that a circulation within the functional housing of a functional module connected to the base module may be reinforced. Via corresponding guiding devices, which are arranged within the functional housing and are embodied to guide the air flow passing through coupling openings of the functional connection element of the functional module into corresponding areas within the functional housing. These areas may e.g. be areas in which components of the electronic functional circuit are arranged that have a high heat generation. In addition, the guiding devices may be embodied to guide the air flow into areas of the functional housing that are as extensive as possible, so that the air flow flowing through the functional housing flows around as large a proportion of the components of the electronic functional circuit as possible. In this way, the most effective possible circulation of the air volume within the functional housing may be achieved, thus achieving the most efficient possible swirling of possible heat pockets and, associated with this, the most efficient possible cooling of the electronic functional circuit within the functional housing of the functional module. In addition, the functional devices may also be set up to accelerate the air flow within the functional housing, thus also achieving a further increase in the cooling effect or cooling power.

According to an embodiment, the guiding devices comprise guiding nozzles arranged at the coupling openings and adapted to guide the air flow into the predetermined area inside the functional housing.

This has the technical advantage that the guiding devices may be embodied as simply as possible. The functional nozzles arranged at the coupling openings may be embodied to save as much space as possible, so that as little installation space as possible is occupied by the guiding devices inside of the functional housing. In addition, the guiding devices in the form of the guiding nozzles may be embodied to be as robust as possible. By embodying the guiding nozzles, precise and directed guidance of the air flow within the functional housing may be achieved. The guiding nozzles also represent a technically simple solution for the guiding devices.

According to an embodiment, the guiding devices comprise a guiding fan element arranged inside the housing.

This achieves the technical advantage that an efficient circulation of the air volume inside the functional housing may be provided. Via the guiding fan element, which is arranged inside of the functional housing, the air flow passing through the coupling openings may be efficiently distributed inside the functional housing, thus allowing for effective and efficient swirling of possible heat pockets. Moreover, via the guiding fan element, a speed of the air flowing through the coupling openings may be increased, thus further enhancing a swirling of the air volume inside the functional housing, which in turn may further increase the cooling effect. The guiding fan element further provides a technically simple solution of the guiding devices. Alternatively, a plurality of guiding fan elements may be embodied in a functional housing.

According to an embodiment, the guiding devices comprises a guiding channel, wherein the guiding channel has a fluidic connection to at least one of the coupling openings, and wherein the guiding channel is embodied to guide the airflow into a predetermined region within the interior of the functional housing.

This achieves the technical advantage that the technically simplest possible embodiment of the guiding devices may be provided in the form of one or a plurality of guiding channels connected to the respective coupling openings. In this case, the guiding channels may guide the air flow passing through the coupling openings into the corresponding areas within the functional housing in which, for example, components of the functional circuitry are arranged which have the strongest possible heat generation. Alternatively, the air flow may be directed via the guiding channel or channels into an area within the functional housing that is as extensive as possible, so that the air flow flows around as large a proportion of the components of the electronic functional circuit as possible. In this way, an individual and improved cooling performance may be achieved.

Alternatively, a combination of guiding nozzles, guiding fan elements and guiding channels may be embodied in a functional housing.

According to an embodiment, the circulation channel is in thermal contact with at least one inner housing wall of the base housing of the base module.

This achieves the technical advantage of providing further cooling of the air volume of the circulation circuit. Via the thermal contact of the circulation channel with at least one inner housing wall of the base housing of the base module, the circulation channel may absorb the heat within the air flow passing through the circulation channel and transfer it to the inner housing wall of the base housing. This may provide a cooling effect of the airflow within the circulation circuit. Thus, by cooling the air flow within the circulation channel, an increased cooling performance may be achieved within the functional modules connected to the base module by reducing the amount of heat absorbed during the flow of the air through the functional housings of the connected functional modules, said heat generated by the components of the electronic functional circuits of the functional modules is transferred to the housing of the base module via the air flow flowing from the functional modules into the circulation channel of the base module, thus achieving an increase in the cooling effect of the air flow flowing around the components of the functional circuits of the functional modules connected to the base module.

According to an embodiment, the circulation channel comprises a first partial channel, a second partial channel, a third partial channel and a fourth partial channel, the first partial channel and the second partial channel being arranged parallel to one another, the third partial channel and the fourth partial channel being arranged parallel to one another, wherein each base connection element comprises a first circulation opening and a second circulation opening, the first circulation opening being fluidically connected to the first partial channel and the second circulation opening being fluidically connected to the second partial channel, wherein the functional connection element comprises a first coupling opening and a second coupling opening, wherein the first coupling opening and the second coupling opening are each fluidically connected to an interior of the functional housing, wherein the first coupling opening may be coupled to the first circulation opening and the second coupling opening may be coupled to the second circulation opening, and wherein a pressure difference may be achieved by the circulating air flow between the first partial channel and the second partial channel.

This achieves the technical advantage that a further increase in the cooling capacity of the passive or closed active cooling of the control-cabinet system may be provided. By embodying the circulation channel with a first partial channel, a second partial channel, a third partial channel and a fourth partial channel, with the first and second partial channels and the third and fourth partial channels being arranged in parallel to one another in each case, it is possible to achieve the simplest possible embodiment of the circulation channel. This simplifies a manufacturing of the base module. Furthermore, by circulating the air flow within the circulation channel in a predetermined circulation direction, a pressure difference between the first partial channel and the second partial channel may be achieved.

By embodying the circulation openings as first circulation openings and second circulation openings, wherein first circulation openings are fluidically connected to the first circulation channel and second circulation openings are fluidically connected to the second circulation channel, it may be achieved that, depending on the pressure difference between the first partial channel and the second partial channel, an air flow flows out of the circulation channel through first circulation openings and through second circulation openings, respectively. When a functional module is connected to the base module, it may thus be achieved that, depending on the pressure difference between the first partial channel and the second partial channel, an air flow from the circulation channel flows into the functional housing through the first circulation openings, from which the air flow flows back into the second partial channel of the circulation channel through the second coupling openings or circulation openings.

Through this, a predetermined circulation of the air volume within the functional housing of the functional module connected to the base module may be directed from the first coupling openings toward the second coupling openings, in that, due to the generated pressure difference between the first partial channel and the second partial channel, the air flow of the circulation channel enters the interior of the functional housing through the first coupling openings and exits the functional housing into the second partial channel of the base module through the second coupling openings. As a result, an effective and efficient swirling of the air volume inside of the functional housing of the functional module connected to the base module and an associated cooling of the components of the electronic functional circuit of the functional module may be achieved.

According to an embodiment, the first coupling opening and the second coupling opening are arranged at two opposite outermost ends of the functional connecting element, and wherein the data connections and voltage connections are arranged on the functional connection element between the first coupling opening and the second coupling opening.

This achieves the technical advantage of providing the widest possible spacing between the first and second coupling openings of the functional module, which may ensure that the air flow entering the functional housing through the first coupling openings and leaving the functional housing through the second coupling openings flows around the widest possible area of the electronic functional circuit arranged in the functional housing. This achieves an increased cooling effect.

According to an embodiment, the control-cabinet system further comprises a heating element, wherein the heating element is integrated into the fluidic circulation circuit, wherein the heating element is embodied to heat a volume of air comprised by the circulation circuit, and wherein the heating element is disposed within the functional housing of the functional element and/or within the circulation channel.

Hereby, the technical advantage is achieved that a condensation of a humidity of the air volume located in the circulation circuit may be avoided. In particular, during a period of non-operation of the control-cabinet system, a constant temperature of the air volume located in the circulation circuit may be ensured by an operation of the heating element, so that a condensation of the air humidity located in the air volume may be avoided. This may prevent damage to the electronic and electrical components of the functional circuitry of the functional modules connected to the base module due to condensation of the humidity of the air volume located in the functional housings, in that a temperature of the air volume may be maintained constantly above a condensation temperature of the air volume by operation of the heating element.

According to an embodiment, the control-cabinet system further comprises a heat exchanger, wherein the heat exchanger is integrated into the circulation circuit, wherein the heat exchanger is arranged to cool the air flow within the circulation circuit, wherein the heat exchanger is an air-to-air heat exchanger or an air-to-water heat exchanger, and wherein the heat exchanger is arranged inside of the functional housing of the functional module and/or inside the base housing of the base module.

This achieves the technical advantage that a further increase in the cooling capacity of the passive or closed active cooling of the control-cabinet system may be achieved. By arranging a heat exchanger within the circulation circuit, a further cooling of the air volume in the circulation circuit may be achieved. This may achieve that the cooled air volume of the circulation circuit may absorb a larger amount of heat generated by the components of the functional circuits of the functional modules connected to the base module.

By arranging the heat exchanger within the circulation channel of the basic module or within a functional housing of a functional module of the control-cabinet system, the most flexible possible embodiment of the control-cabinet system may be achieved in that, depending on the requirements for the installation space of the control-cabinet system, the heat exchanger may be arranged in the module of the control-cabinet system that permits an arrangement based on the required installation space. This may provide a control-cabinet system with the smallest possible dimensions. Moreover, a plurality of heat exchangers may be arranged within the circulation channel of the base module or within a plurality of functional housings of different functional modules, respectively, thus a further increasing of the cooling capacity of the passive or closed active cooling of the control-cabinet system.

Alternatively, the heat exchanger may also be set up in the functional housing of a cooling module, wherein the cooling module is a functional module that only serves to cool the air volume within the circulation circuit and does not have any electronic functional circuitry.

According to an embodiment, cooling fins and/or water cooling are embodied on the second housing face of the base housing of the base module, and/or wherein cooling fins are embodied on a housing surface of the functional module.

This achieves the technical advantage that a further increase in the cooling capacity of the passive or closed active cooling of the control-cabinet system is allowed for. By arranging cooling fins on a second housing face of the base housing and/or by arranging water cooling on the second housing face of the base housing and/or by arranging further cooling fins on the functional housing of the functional module, it may be achieved that heat generated within the base housing of the base module or within the functional housings of the functional modules connected to the base module may be dissipated via the respective base housing or functional housing to the ambient air surrounding the control-cabinet system. The arrangement of the cooling fins on the respective housing faces increases the dissipation of heat via the respective housing to the ambient air. Similarly, water cooling at the base housing increases the dissipation of heat generated inside the base housing via the base housing to the ambient air surrounding the control-cabinet system.

According to an embodiment, an external fan element is embodied on the third housing surface of the base module, the external fan element being arranged to guide cooling air along the cooling fins, and/or wherein a further external fan element is formed on a further housing surface of the functional module, the further external fan element being arranged to guide cooling air along the further cooling fins.

This achieves the technical advantage that a further increase in the cooling performance of the passive or closed active cooling of the control-cabinet system may be achieved. By embodying external fan elements, which are arranged on the outer surfaces of the base housing of the base module or the functional housings of the functional modules and are aligned to guide an air flow along the cooling fins embodied on the base housing or the functional housings, a further increase in the dissipation of the heat generated in the base housing or the functional housings via the respective housings to the ambient air surrounding the control-cabinet system may be achieved.

According to an embodiment, an internal fan element is arranged in the interior of the functional housing, wherein the internal fan element is arranged to guide cooling air along at least one inner wall of the functional housing, and/or wherein a further internal fan element is arranged in an interior of the base housing, wherein the further internal fan element is arranged to guide cooling air along at least one inner wall of the base housing.

This achieves the technical advantage that a further increase in the cooling performance of the passive or closed active cooling of the control-cabinet system may be achieved. By embodying internal fan elements, which are arranged within the base housing of the base module and/or within the functional housings of the functional modules connected to the base module, and which are embodied to guide a cooling air flow to the inner walls of the respective housings, no cooling of the base housing or the functional housings may be achieved, whereby in turn a cooling of the air volume located within the circulation circuit may be achieved via a release of the heat located within the air volume to the cooled base housing or functional housing. By cooling the air volume within the circulation circuit, an ability of the air volume to absorb heat of the components of the functional circuits of the functional modules is increased, thus achieving an increase of the cooling capacity of the circulation circuit and the associated passive or closed active cooling of the control-cabinet system.

According to an embodiment, components of the electrical circuit of the functional module comprise a thermal contact with a housing inner wall of the functional housing.

This achieves the technical advantage that direct cooling of the components of the electronic functional circuits of the functional modules connected to the base module is provided. Via thermal couplings of the individual components of the functional circuits to inner walls of the respective functional housings, heat generated by the operation of the functional circuit may be directly transferred to the ambient air surrounding the control-cabinet system via the functional housing. This may result in a further increase in the cooling capacity of the passive or closed active cooling of the control-cabinet system.

According to an embodiment, the functional housing and/or the base housing is made of a material with a thermal conductivity of at least 10 W/mK.

This achieves the technical advantage that the heat generated in the base housing or the functional housings may be emitted to the environment of the control-cabinet system via the respective housing walls to the greatest possible extent. For this purpose, the individual housings of the modules of the control-cabinet system may be made of an advantageous metal alloy that has a high thermal conductivity and may thus radiate a high amount of heat to the environment of the control-cabinet system. This further increases the cooling capacity of the passive or closed active cooling of the control-cabinet system.

According to an embodiment, the functional housing and/or the base housing is coated with a coating having a thermal conductivity of at least 10 W/mK.

This achieves a further increase in the cooling capacity of the passive or closed active cooling of the control-cabinet system. The thermal conductivity of the individual housings of the modules of the control-cabinet system may be further increased by a corresponding coating of the housing walls of the individual modules of the control-cabinet system, whereby a further increase in the radiation of the heat located in the respective housings via the housing walls to the environment of the control-cabinet system may be achieved.

In the invention, a feature may be positive, i.e., present, or negative, i.e., absent, with a negative feature not being explicitly explained as a feature unless the invention emphasizes that it is absent, i.e., the invention actually made and not one constructed by the prior art is to omit that feature.

The features of the description may also be interpreted as optional features; i.e. each feature may be understood as an optional, arbitrary or preferred, i.e. a non-binding, feature. Thus, it is possible to extract a feature, possibly including its periphery, from an example of an embodiment, in which case this feature may be applied to a generalized idea of the invention. The absence of a feature in an embodiment example shows that the feature is optional with respect to the invention.

The invention is explained in more detail below with reference to embodiment examples of variants of a modular control-cabinet system. Although the invention is described and illustrated in more detail by the embodiments, the invention is not limited by the disclosed embodiments, but is of a more fundamental nature.

FIG. 1 shows a perspective schematic view of a control-cabinet system 100 according to an embodiment.

In the embodiment shown in FIG. 1, the control-cabinet system 100 comprises a base module 200 and a functional module 300. The functional module 300 is connected to the base module 200 via corresponding connections.

The base module 200 comprises a base housing 201 having a first housing face 202. A plurality of base connection elements 203 are disposed on the first housing face 202. Each base connection element 203 comprises base voltage connections 205 and base data connections 207. The base voltage connections 205 are connected via a voltage line 209. The base data connections 207 are connected via a data line 211. The base module 200 further comprises a plurality of switch-on units 213 connected to the base data connections 207 via the data line 211. The base voltage connections 205 and the voltage line 209 may provide an extra-low voltage and/or a low voltage. The switch-on units 213 may be ASICs, and the data line 211 may be a data bus and provide data communication between the base module 200 and the functional modules 300.

The base module 200 further comprises a circulation channel 215 embodied inside of the base housing 201. Within the circulation channel 215, circulation of an airflow is provided. Each base connection element 203 further comprises circulation openings 217 in fluid communication with the circulation channel 215.

Figure 5:
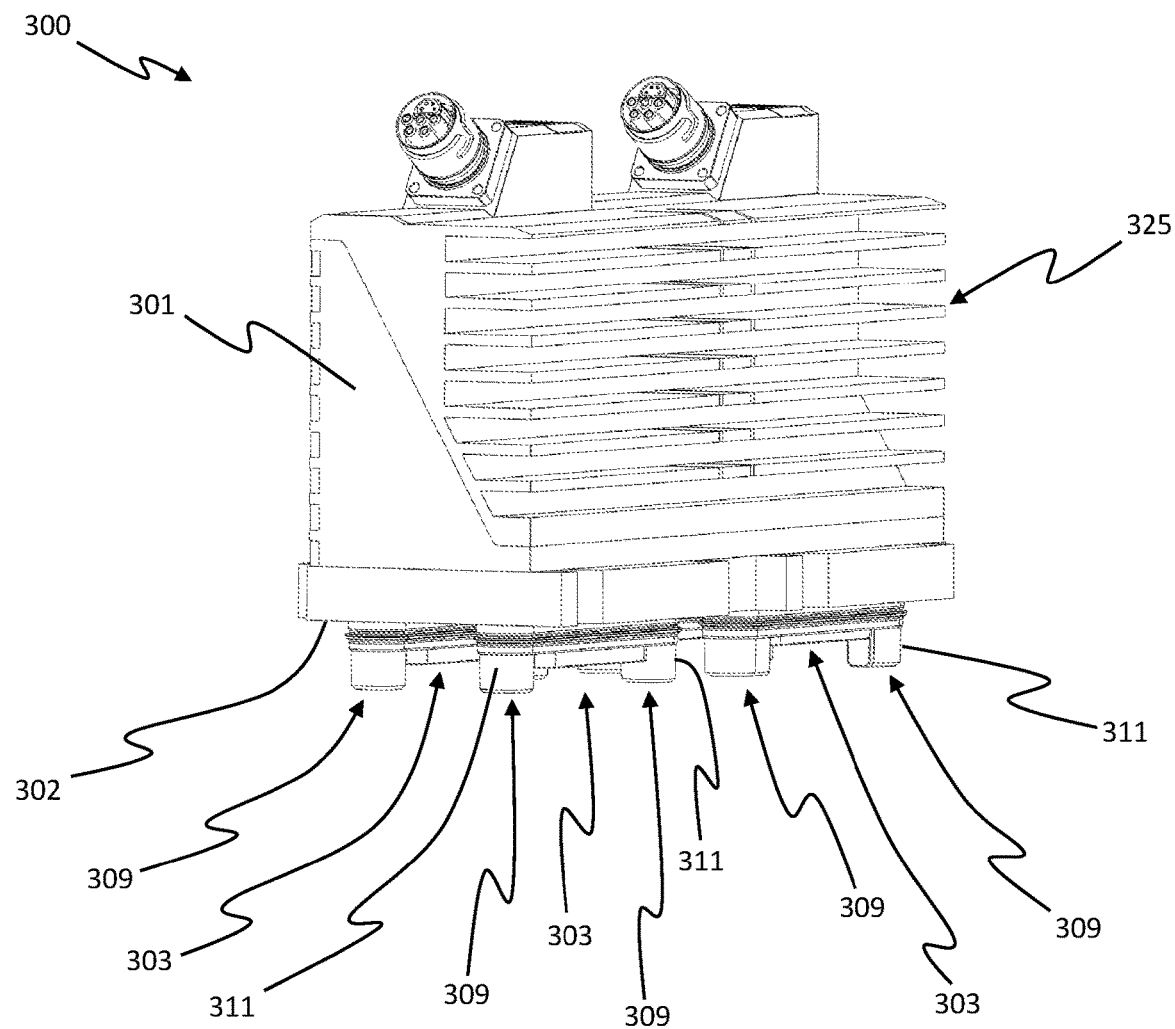
FIG. 5 is a perspective schematic view of a functional module according to an embodiment.

The functional module 300 comprises a functional housing 301 and is connected to the base module 200. At an underside of the functional housing 301, the functional module 300 comprises a functional connection element with voltage connections and data connections. The functional connection element is shown in FIG. 5. The data connections and voltage connections of the functional connection element of the functional module 300 may be connected to the base data connections 207 and the base voltage connections 205 of the base connection element 203 of the base module 200, thereby establishing a data connection and a voltage connection between the base module 200 and the functional module 300. Furthermore, the functional connection element of the functional module 300 comprises coupling openings that may be coupled to the circulation openings 217 of the base connection elements 203 of the base module 200. By connecting the functional module 300 to the base module 200 via a coupling of the functional connection element of the functional module 300 to one of the base connection elements 203 of the base module 200, a coupling of the circulation openings 217 of one of the base connection elements 203 of the base module 200 and the coupling openings of the functional connection element of the functional module 300 is achieved. Through this, a fluidic connection between an interior of the functional housing 301 of the functional module 300 and the circulation channel 215 of the base module 200 is achieved. FIG. 1 shows such a connection between the functional module 300 and the base module 200, in which a fluidic connection is achieved between the interior of the functional housing 301 and the circulation channel 215 of the base module 200.

A circulation circuit 101 is established via the fluidic connection between the interior of the functional housing 301 of the functional module 300 and the circulation channel 215 of the base module 200, which includes the circulation channel 215 of the base module 200 and the interior of the functional housing 301 of the functional module 300 connected to the base module 200. Within the circulation circuit 101, circulation of an air flow is allowed for, which is shown by the arrows in FIG. 1. Within the circulation channel 215, the circulation of the airflow extends in a predetermined circulation direction and flows into the interior of the functional housing 301 via one of the coupling openings, from which the circulating airflow flows out of another coupling opening and re-enters the circulation channel 215 of the base module 200.

The circulation of the airflow within the circulation circuit 101 may e.g. be achieved by convection, in that due to different temperatures within the functional housing 301 of the functional module 300 and the circulation channel 215 of the base module 200, respectively, a pressure difference is created that leads to a circulation within the air volume of the circulation circuit 101 and an associated formation of a circulating airflow.

Figure 7:
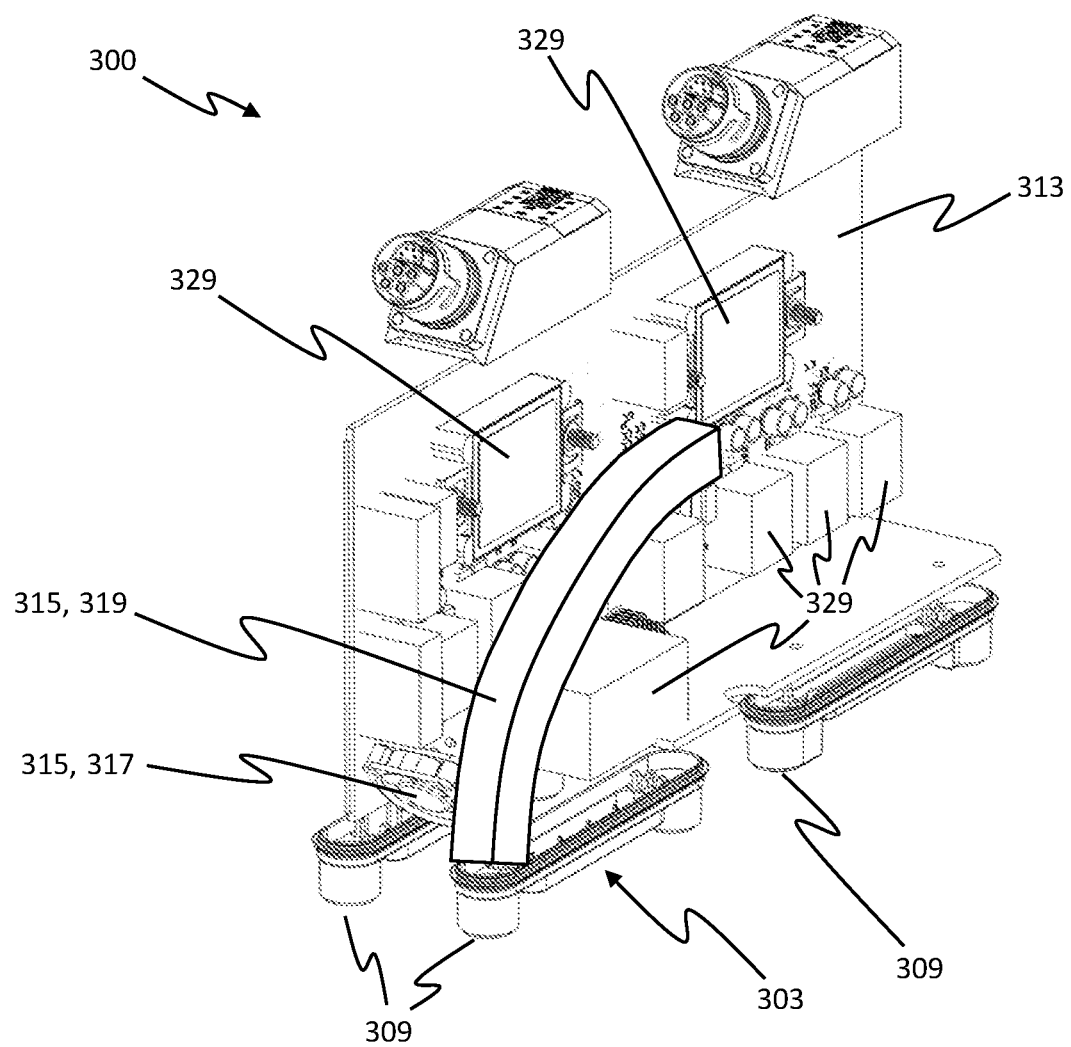
FIG. 7 is a schematic internal view of the functional module in FIG. 5.

The functional module 300 further comprises an electronic functional circuit arranged in the functional housing 301. The functional circuit is shown in FIG. 7. Via the air flow circulating in the circulation circuit 101, mixing of the air volume located inside of the functional housing 301 of the functional module 300 may be achieved, thereby avoiding the formation of heat pockets inside of the functional housing 301.

In this regard, heat pockets describe areas of the air volume within a functional housing 301 that have an elevated temperature due to localized heating by components of the electronic functional circuitry of the respective functional module 300. Thorough mixing of the air volume within the functional housing 301 may disperse these areas, resulting in a uniform temperature distribution within the air volume within the functional housing 301 and associated cooling performance.

The illustration of the control-cabinet system 100 shown in FIG. 1 is merely of an exemplary nature and does not represent a detailed or true-to-size illustration of a control-cabinet system 100 according to the present application. In particular, a plurality of base connection elements 203 may be embodied on the base module 200 in deviation from the embodiment shown in FIG. 1. Furthermore, a plurality of functional modules 300 may be connected to the base module 200. Furthermore, the circulation channel 215 may have a different configuration from that shown in FIG. 1. For example, the circulation channel 215 may have a circular or elliptical shape. Moreover, the arrangements of the base voltage connections 205 or base data connections 207 as well as the circulation openings 217 on the respective base connection elements 203 may deviate from the representation shown in FIG. 1.

Furthermore, FIG. 1 shows a sectional plane A which is used to describe further figures.

Figure 2:
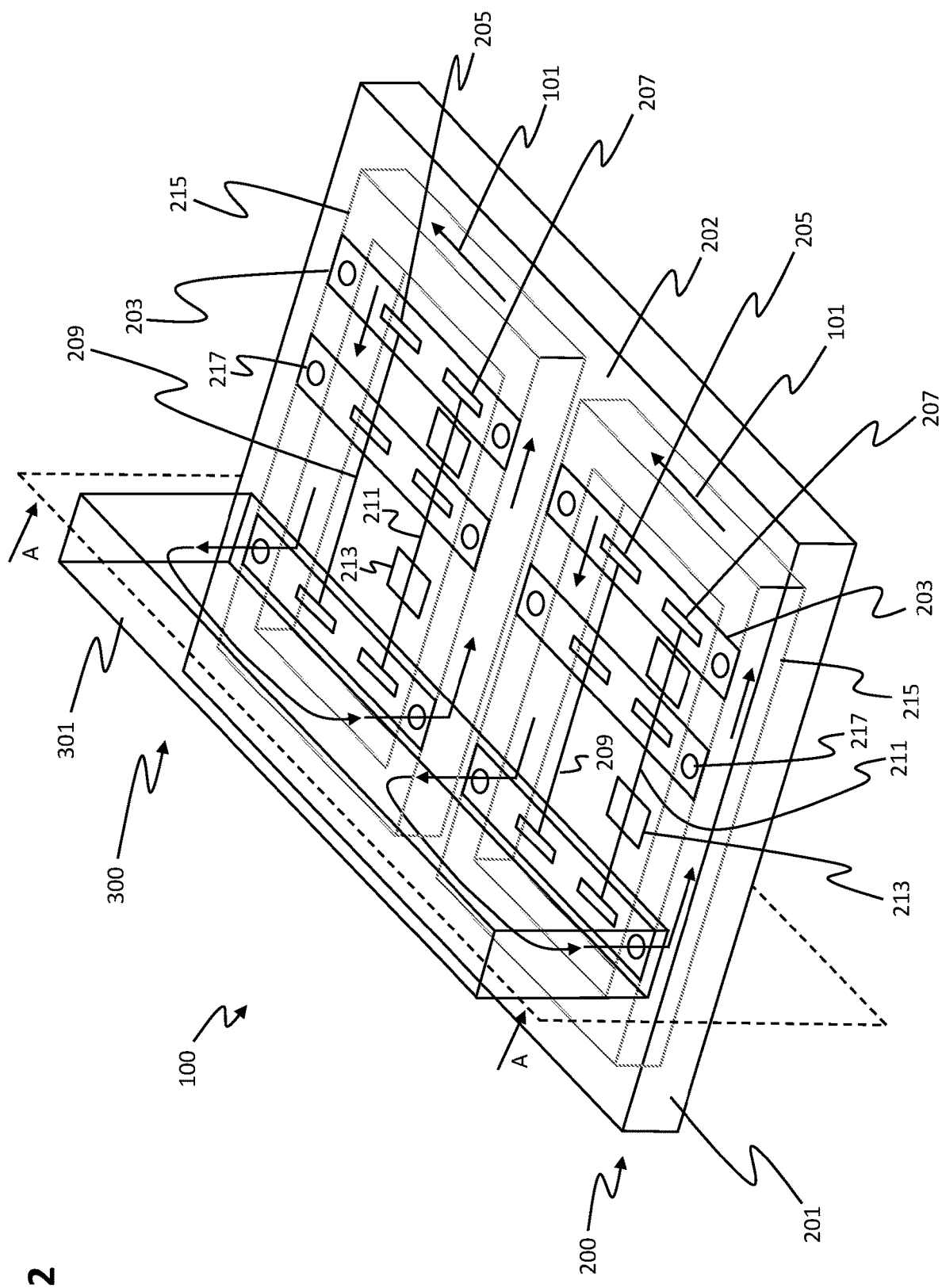
FIG. 2 is a further perspective schematic view of a control-cabinet system according to a further embodiment.

FIG. 2 shows another perspective schematic view of the control-cabinet system 100 according to a further embodiment.

In FIG. 2, the base module 200 comprises two circulation channels 215 arranged side by side in the base housing 201. An airflow may circulate in each circulation channel 215 according to a circulation circuit 101 defined by the circulation channel 215.

Each circulation channel 215 is embodied similarly to the one in FIG. 1. Furthermore, compared to the embodiment in FIG. 1, the base module 200 comprises two sets of base connection elements 203 with base data connections 207 and base voltage connections 205, data lines 211, voltage lines 209, switch-on units 213, each of which is embodied analogously to the embodiment in FIG. 1. Each base connection element 203 further comprises circulation openings 217 which are fluidically connected to circulation channel 215.

In FIG. 2, the control-cabinet system 100 in FIG. 2 comprises a functional module 300 according to a further embodiment. In the embodiment shown in FIG. 2, the functional module 300 is arranged to couple to the base module 200 via the two sets of base connection elements 203. Thus, the functional module 300 is arranged to be in fluidic communication with the two adjacent circulation channels 215. As shown in FIG. 2, a circulating air flow may thus enter the functional housing 301 via each of the two circulation circuits 101 and provide for mixing of the air volume in the functional housing 301.

Figure 3:
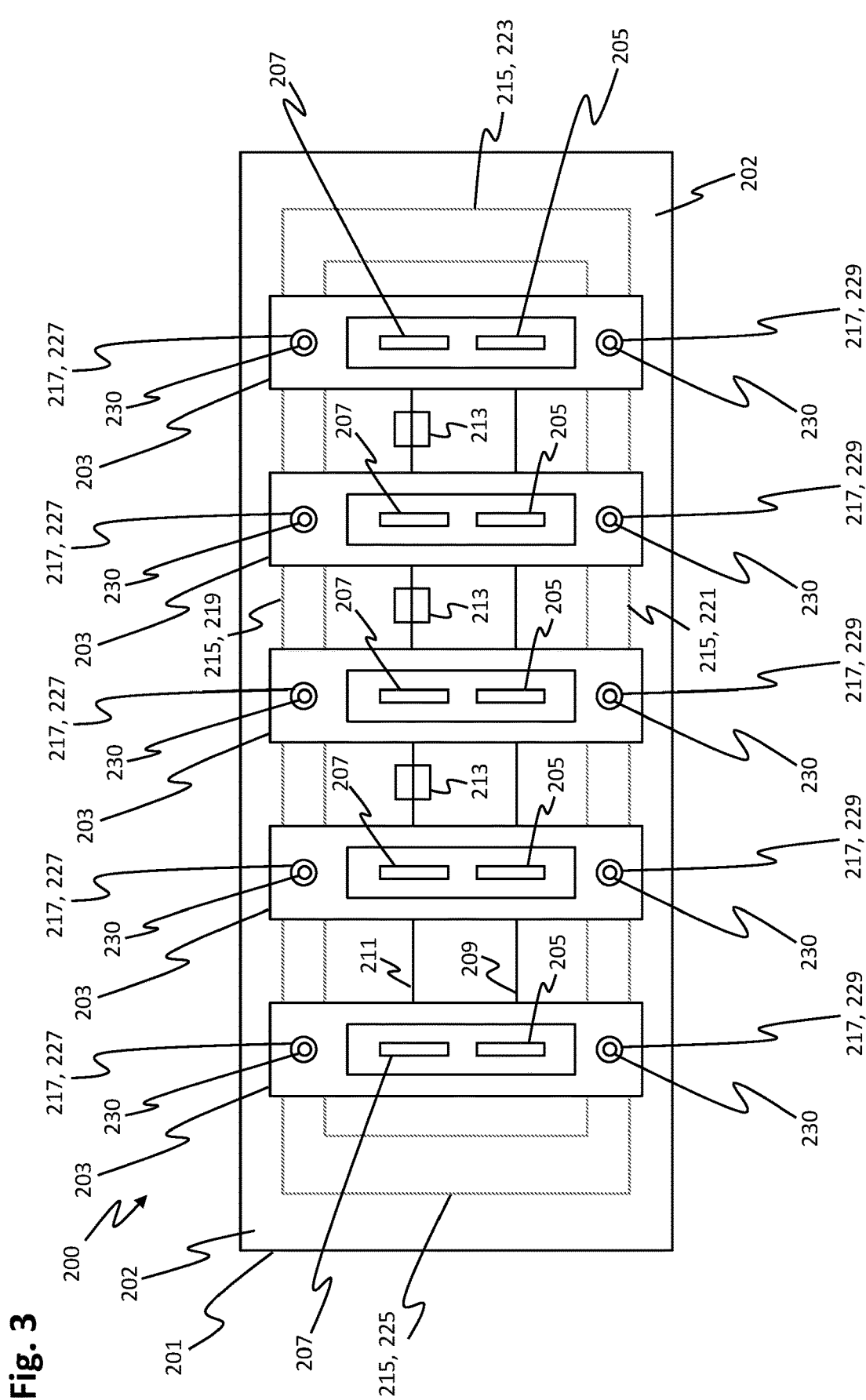
FIG. 3 is a schematic top view of a base module according to an embodiment.

FIG. 3 shows a schematic top view of a base module 200 according to an embodiment.

In FIG. 3, the base module 200 of the control-cabinet system 100 is shown according to a further embodiment. Differing from the embodiment in FIG. 1, the circulation channel 215 comprises a first partial channel 219, a second partial channel 221, a third partial channel 223 and a fourth partial channel 225. The first partial channel 219 is embodied in parallel to the second partial channel 221 and the third partial channel 223 is embodied in parallel to the fourth partial channel 225.

Furthermore, each base connection element 203 comprises a first circulation opening 227 in fluid communication with the first partial channel 219 and a second circulation opening 229 in fluid communication with the second partial channel 221. Furthermore, each circulation opening 217 is provided with a regulating device 230 arranged to regulate an air flow through the respective circulation opening 217. The regulating devices 230 may e.g. be embodied as corresponding nozzle elements.

Alternatively, the regulating devices 230 may be configured to modify a diameter of the respective circulation opening 217. The regulating devices 230 allow for an identical air flow to flow through each circulation opening 217. In this way, it may be achieved that when a plurality of functional modules 300 are arranged on the base module 200 and connected to the respective base connection elements 203 consecutively, an air flow of the circulation circuit 101 of identical strength flows into the respective functional housing 301 through the respective circulation openings 217. Furthermore, the regulating devices 230 may have a pressure-compensating effect and be embodied to always ensure the same volume exchange or volume flow of the circulating air even with different pressure differences.

This in turn ensures that regardless of the positioning of the respective functional module 300 at the base module 200 and regardless of the number of functional modules 300 positioned at the base module 200, each functional module 300 is supplied with an identically strong air flow and thus with an identical cooling capacity.

Alternatively, the regulating devices 230 may be used to individually adjust an airflow for specific functional modules 300 so that a correspondingly strong airflow is provided for functional modules 300 with a strong heat generation and a comparatively weak airflow is provided for functional modules 300 with a comparatively low heat generation.

Figure 4:
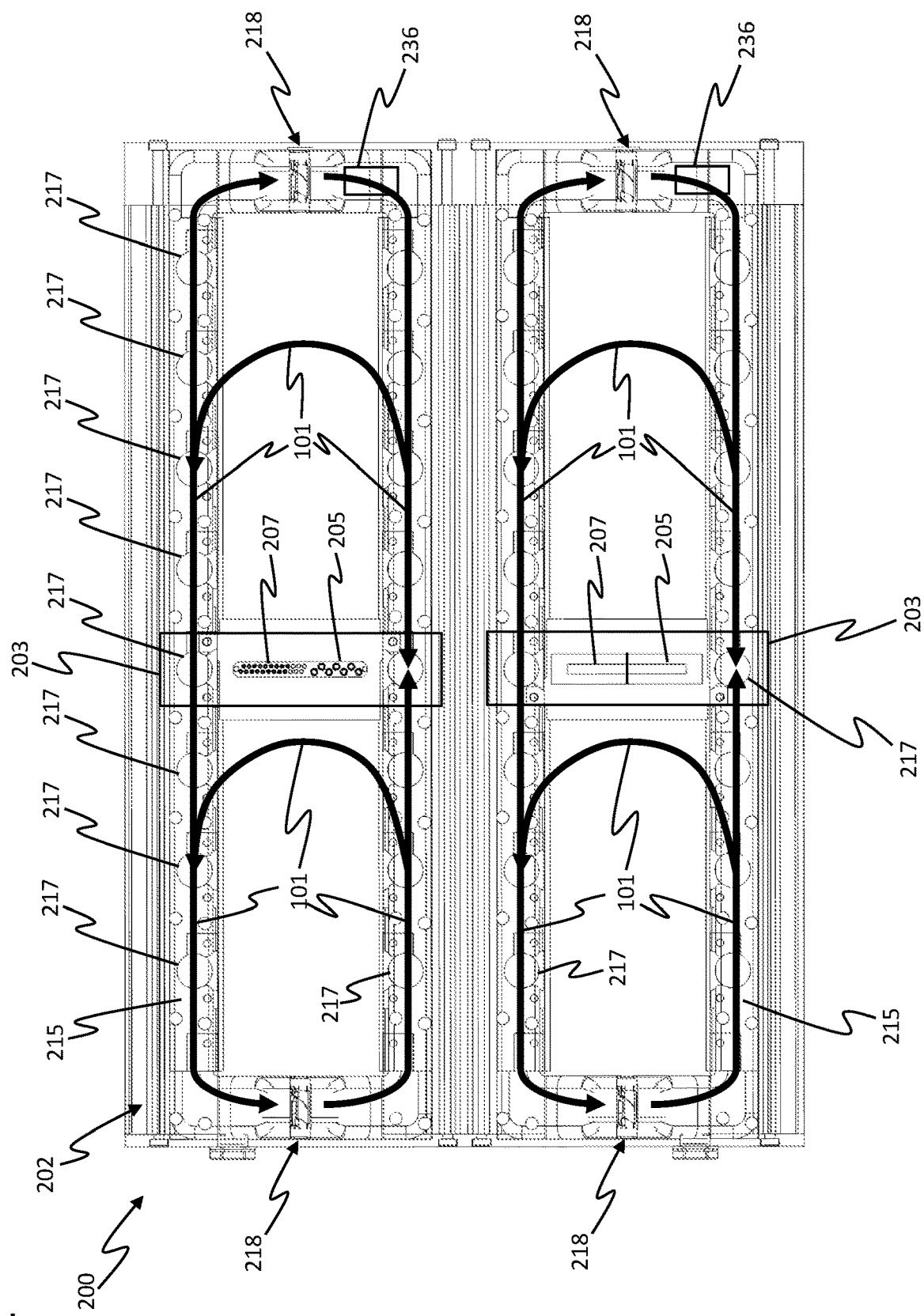
FIG. 4 is a further schematic top view of a base module according to a further embodiment.

FIG. 4 shows another schematic top view of a base module 200 according to a further embodiment.

Deviating from the embodiment in FIG. 3, the base module 200 in FIG. 4 comprises two circulation channels 215 arranged side by side. In addition, the base module 200 comprises two rows of base connection elements 203 arranged in parallel, each comprising base voltage connections 205, base data connections 207 and circulation openings 217.

As an alternative to the embodiment shown here, the basic connection elements 203 may also be embodied differently. For example, the basic connection elements 203 may each have one row with data and extra-low voltage connections and one row with low-voltage connections. Alternatively, the base connection elements 203 may comprise two rows of data and extra-low voltage connections. Alternatively, the base connection elements 203 may comprise one row with data and extra-low voltage connections and one row with data and extra-low voltage connections and low voltage connections.

In each circulation channel 215, a circulating air flow is shown according to the circulation circuit 101. Deviating from the embodiment in FIG. 1 and FIG. 3, respectively, the base module 200 in FIG. 4 further comprises four fan elements 218 arranged in pairs in each of the two circulation channels 215. The fan elements 218 are embodied to accelerate the air volume within the circulation channel 215 or within the circulation circuit 101, respectively, and thus to generate or drive a circulating air flow.

As an alternative to the embodiment shown in FIG. 4, each circulation channel 215 may be embodied with only one fan element 218. Alternatively, the fan elements 218 may be arranged within a functional housing 301 of a functional module 300, so that when the respective functional module 300 is connected to the base module 200, the operation of the fan element 218 arranged within the respective functional housing 301 may cause the air volume within the circulation circuit 101 to circulate.

Alternatively, the control-cabinet system 100 may comprise a functional module 300 configured as a cooling module. However, a functional module 300 configured as a cooling module does not include a functional circuit, however, it may be configured having at least one fan element 218 disposed within the respective functional housing 301 of the functional module 300 configured as a cooling module.

A circulation direction of the circulating airflow is shown by the arrows in FIG. 4. As an alternative to the circulation direction shown in FIG. 4, any circulation of the air volume within the circulation circuit 101 or within the circulation channel 215, respectively, may be achieved by an appropriate operation of the fan elements 218.

Additionally, in the embodiment shown in FIG. 4, the base module 200 comprises two heat exchangers 236 each formed in a circulation channel 215. The heat exchangers 236 may be used to cool the air volume circulating in the circulation circuit 101 or in the circulation channel 215, respectively, by releasing a quantity of heat stored in the air volume to the respective heat exchanger 236 as it flows past the respective heat exchanger 236. As an alternative to the embodiment shown in FIG. 4, any number of heat exchangers may be arranged within the circulation channels 215 of the base module 200. Alternatively, heat exchangers 236 may be arranged within one or a plurality of functional housings 301 of one or a plurality of functional modules 300, such that a cooling effect of the volume of air disposed within the respective functional housing 301 may be achieved as it flows past the respective heat exchanger 236.

Alternatively, at least one heat exchanger 236 may be arranged within a functional housing 301 of a functional module 300 configured as a cooling module.

FIG. 5 shows a perspective schematic view of a functional module 300 according to an embodiment.

In the embodiment shown in FIG. 5, the functional module 300 comprises further cooling fins 325 on a side of the functional housing 301, which allow for a cooling effect of the air volume located inside the functional housing 301. Via the further cooling fins 325, a radiation of a quantity of heat to an environment of the functional module 300 is enhanced by increasing the surface area of the respective side of the functional housing 301.

Furthermore, in the embodiment shown in FIG. 5, the functional module 300 comprises a plurality of functional connection elements 303 at an underside 302 of the functional housing 301. Each functional connection element 303 comprises two coupling openings 309. Each coupling opening 309 comprises a surrounding coupling collar 311 that protrudes from the functional connection element 303.

Figure 6:
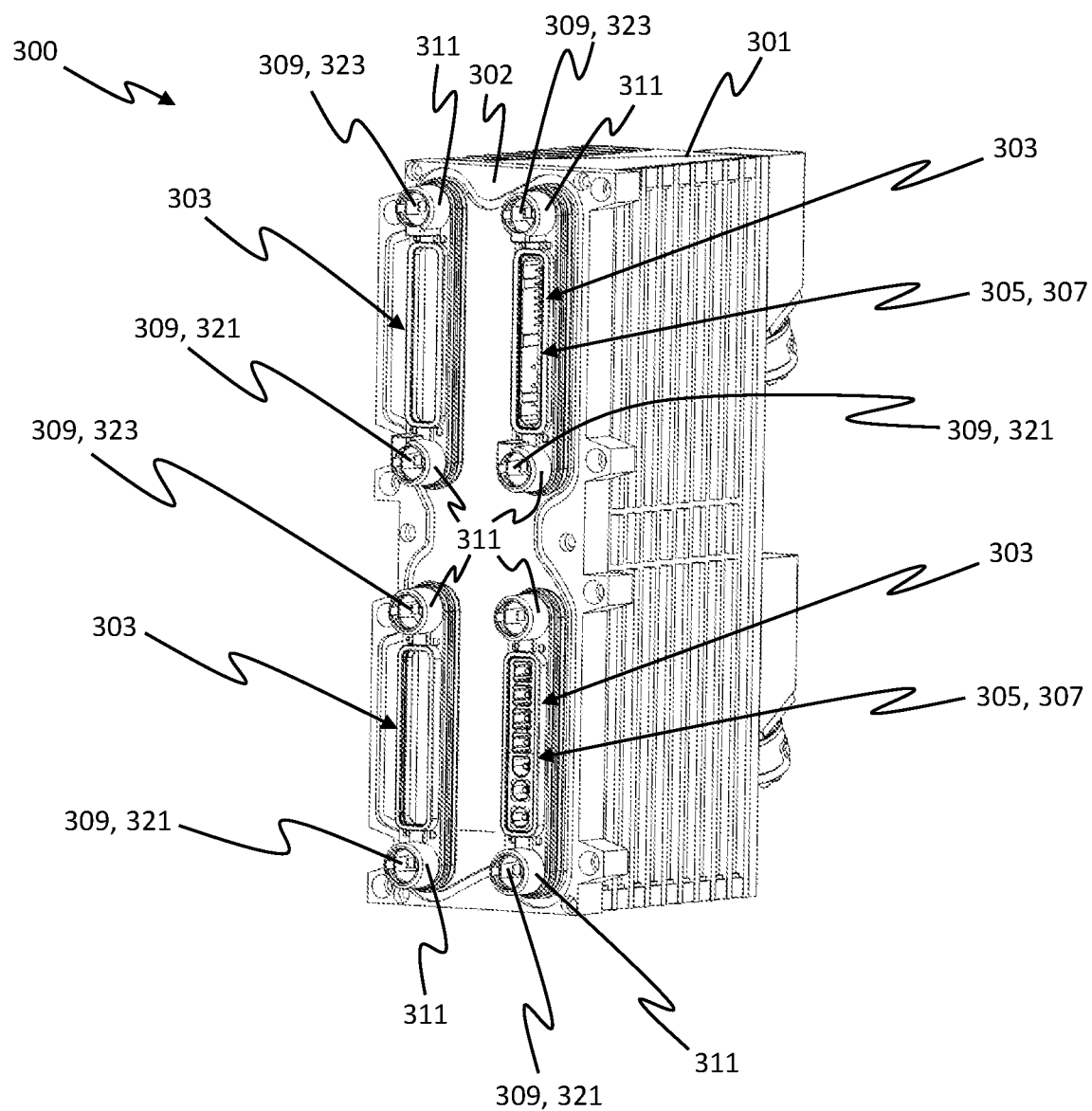
FIG. 6 is a schematic bottom view of the functional module in FIG. 5.

FIG. 6 shows a schematic bottom view of the functional module 300 in FIG. 5.

FIG. 6 shows the arrangement of the individual functional connection elements 303 at the housing underside 302 of the functional housing 301 of the functional module 300 in FIG. 5. Four functional connection elements 303 are arranged on the housing underside 302, each of which is arranged in pairs one behind the other in two vertically oriented directions. In this case, the functional connection elements 303 are rod-shaped and correspond to the structure of the basic connection elements 203 of the basic module 200 shown in FIGS. 1 to 4. Each functional connection element 303 may comprise voltage connections 305 and data connections 307, each of which is arranged next to the other on the functional connection element 303. Alternatively, the configuration of the functional connection elements 303 of a functional module 300 may be different. For example, individual functional connection elements 303 may remain unassigned and thus not include data connections 307 or voltage connections 305. Other functional connection elements 303 may each comprise only data connections 307 or only voltage connections 305. The arrangement of the connections in the embodiment in FIG. 6 is merely exemplary.

In addition, each functional connection element 303 comprise two coupling openings 309 disposed at opposite ends of the functional connection elements 303, respectively. Each coupling opening 309 comprises a coupling collar 311 surrounding the coupling opening 309 and protruding from the functional connection element 303. The two coupling openings 309 of each functional connection element 303 are each divided into a first coupling opening 321 and a second coupling opening 323. According to the embodiment shown in FIG. 3 of the base module 200, the first coupling opening 321 may be coupled to the first circulation opening 227 and the second coupling opening 323 may be coupled to the second circulation opening 229.

Deviating from the embodiment shown in FIG. 6, a functional module 300 may comprise any number of functional connection elements 303. Furthermore, the arrangement of coupling openings 309 on a functional connection element 303 may differ from the arrangement shown in FIG. 6.

FIG. 7 shows a schematic internal view of the functional module 300 in FIG. 5.

In FIG. 7, the interior of the functional module 300 of FIG. 5 and FIG. 6, respectively, is shown. The electronic functional circuit 313 arranged inside of the functional housing 301 comprises a plurality of components 329 of the electronic functional circuit 313. The components 329 shown in FIG. 7, or the electronic functional circuit 313 shown, respectively, are merely exemplary in nature and may differ from functional module 300 to functional module 300 depending on the functionality of the respective functional module 300.

In the embodiment shown in FIG. 7, the functional module 300 further comprises guiding devices 315 configured to guide an airflow entering the interior of the functional housing 301 through at least one of the coupling openings 309 to a predetermined region within the functional housing 301. In the embodiment shown in FIG. 7, the guiding device 315 is formed, in one aspect, as a guiding fan element 317 that may guide an airflow through the interior of the functional housing 301 as desired. The predetermined area within the functional housing 301 may e.g. be the area of a particular component 329 of the electronic functional circuit 313 that has a particular heat generation.

Alternatively, the region may comprise the entire interior of the functional housing 301 or a majority of the electronic functional circuit 313, such that an airflow guided by the guiding devices 315 or the guiding fan element 317 flows around a majority of the functional circuit 313. In the embodiment shown in FIG. 7, a guiding device 315 is further formed as a guiding channel 319 that extends from a coupling opening 309 into the interior of the functional housing 301 and is configured to guide the airflow flowing from the coupling opening 309 into the functional housing 301 into a predetermined region within the functional housing 301.

As an alternative to the embodiment shown in FIG. 7, any of a plurality of guiding fan elements 317 may be arranged at various locations within the functional housing 301. Furthermore, a plurality of differently shaped guiding channels 319 may be arranged within the functional housing 301.

Alternatively, guiding devices 315 may be guiding nozzles 316 (FIG. 8) disposed at respective coupling openings 309.

The guiding fan elements 317 and/or the guiding channels 319 and/or the guiding nozzles 316 (FIG. 8) may be made of plastic, metal, or a suitable composite material.

Figure 8:
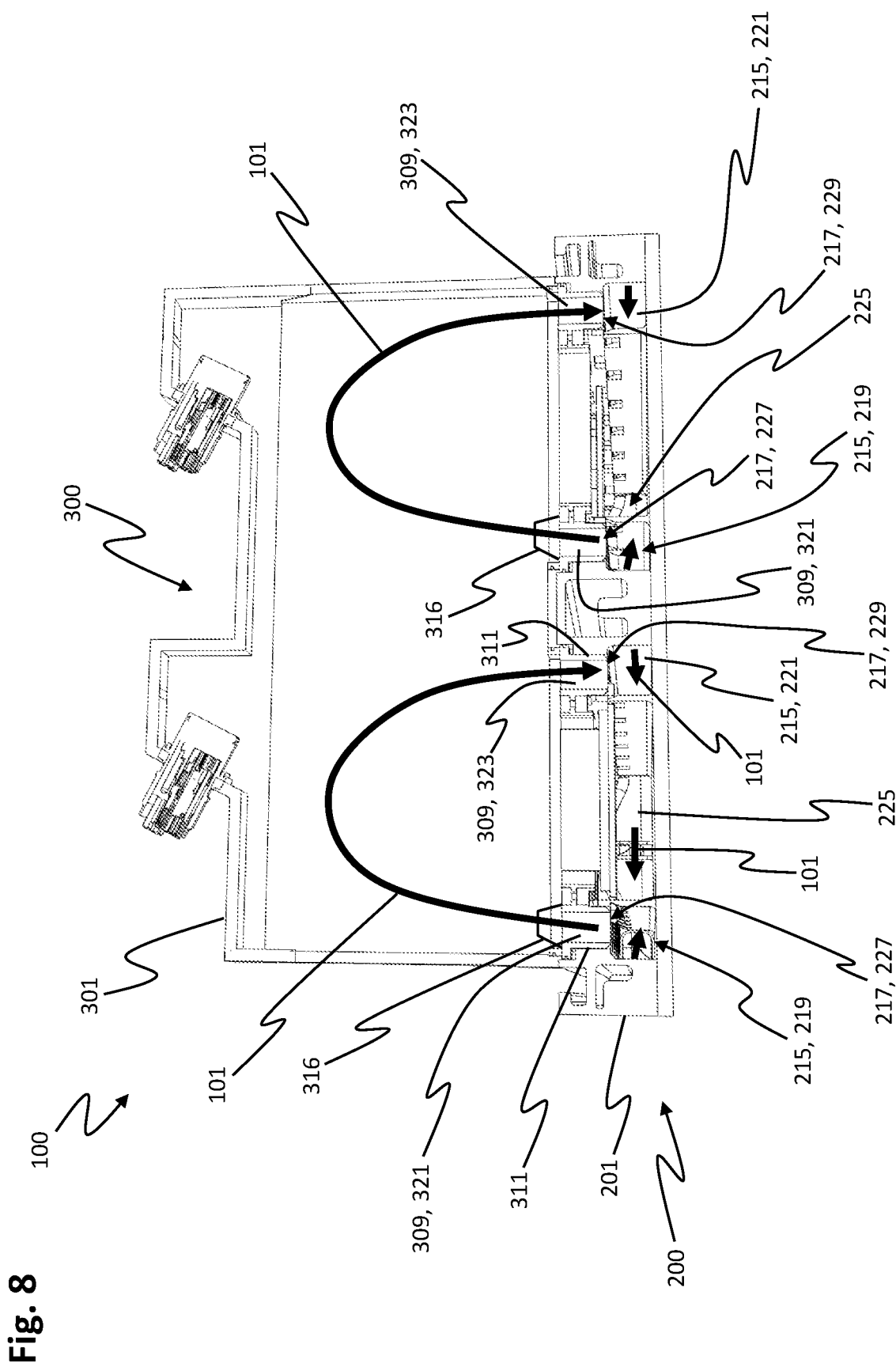
FIG. 8 is a schematic sectional view along a sectional axis A of the control-cabinet system in FIG. 2.

FIG. 8 shows a schematic sectional view along a sectional axis A of the control-cabinet system 200 in FIG. 2.

In FIG. 8, a path of an airflow flowing through the circulation circuit 101 is shown through the interior of the base housing 201 of the base module 200 and through the interior of the functional housing 301 of the functional module 300, respectively, of a control-cabinet system 100 having a base module 200 according to the embodiment in FIG. 4 and a functional module 300 according to the embodiments in FIGS. 5 to 7.

The sectional view corresponds to the sectional plane A shown in FIG. 2.

In FIG. 8, analogous to the embodiment in FIG. 4, the base module 200 comprises two circulation channels 215 arranged side by side. Each of the two circulation channels 215 comprises a first partial channel 219, a second partial channel 221 arranged in parallel thereto and a third partial channel 223 as well as a fourth partial channel 225 arranged in parallel thereto. In FIG. 8, the third partial channel 223 is not shown due to the sectional view (see FIGS. 3, 12).

Furthermore, the base module 200 comprises a plurality of base connection elements 203, which are not shown in FIG. 8 due to the sectional view (see FIGS. 1-4). Each of the base connection elements 203 comprises a first circulation opening 227 and a second circulation opening 229. The first circulation opening 227 is fluidically connected to the first partial channel 219. The second circulation opening 229 is fluidically connected to the second partial channel 221.

Similar to the embodiments shown in FIGS. 5 through 7, the functional module 300 shown comprises four functional connection elements 303, which are not shown in FIG. 8 due to the sectional view (see FIGS. 5-7, 10). Each of the functional connection elements 303 comprises a first coupling opening 321 and a second coupling opening 323. Each coupling opening 309 comprises a coupling collar 311 that protrudes from the functional connection element 303. In FIG. 8, the coupling collars 311 of the respective coupling openings 309 are inserted into the corresponding circulation openings 217 of the base module 200. Thus, in FIG. 8, the first coupling openings 321 are connected to the first circulation openings 227 and the second coupling openings 323 are connected to the second circulation openings 229.

Furthermore, guiding nozzles 316 are embodied on the first coupling openings 321 to guide the airflow entering the interior of the functional housing 301 through the first coupling openings 321 to a predetermined area within the functional housing 301.

This provides a fluidic connection between the circulation channel 215 and the interior of the functional housing 301 of the functional module 300.

In the embodiment shown in FIG. 8, a circulation of an airflow along the circulation circuit 101 is such that within the second partial channel 221 of the circulation channel 215, the flow direction of the airflow points into the paper level of FIG. 8, which is illustrated by the arrow shown in the second partial channel 221. In the fourth partial channel 225, the direction of flow is from right to left as illustrated by the arrow. In the first partial channel 219, the flow direction extends out of the paper level of FIG. 8. From the first partial channel 219, the circulating air flow runs through the first circulation opening 227 or the first coupling opening 321 coupled thereto into the interior of the functional housing 301 of the functional module 300. Within the functional module 300, the circulating air flow runs along the electronic functional circuit 313 arranged in the functional housing 301 and leaves the functional housing 301 through the second coupling opening 323 and enters the second partial channel 221 through the second circulation opening 229 coupled thereto. This achieves a circulating airflow that passes through the circulation channel 215 of the base module 200 and through the interior of the functional housing 301 of the functional module 300.

The path of the circulating air flow within the functional housing 301 is shown as a mere example in FIG. 8. As an alternative to the path shown in FIG. 8, the path within the functional housing 301 may deviate due to any objects within the functional housing 301, e.g. components 329 of the electronic functional circuit 313 or further guiding devices 315. In particular, an air flow is also possible that is exchanged between the two circulation channels and e.g. enters the functional housing 301 via the first coupling opening 321 of one circulation channel and exits the functional housing 301 again via the second coupling opening 323 of the respective other circulation channel.

Figure 9:
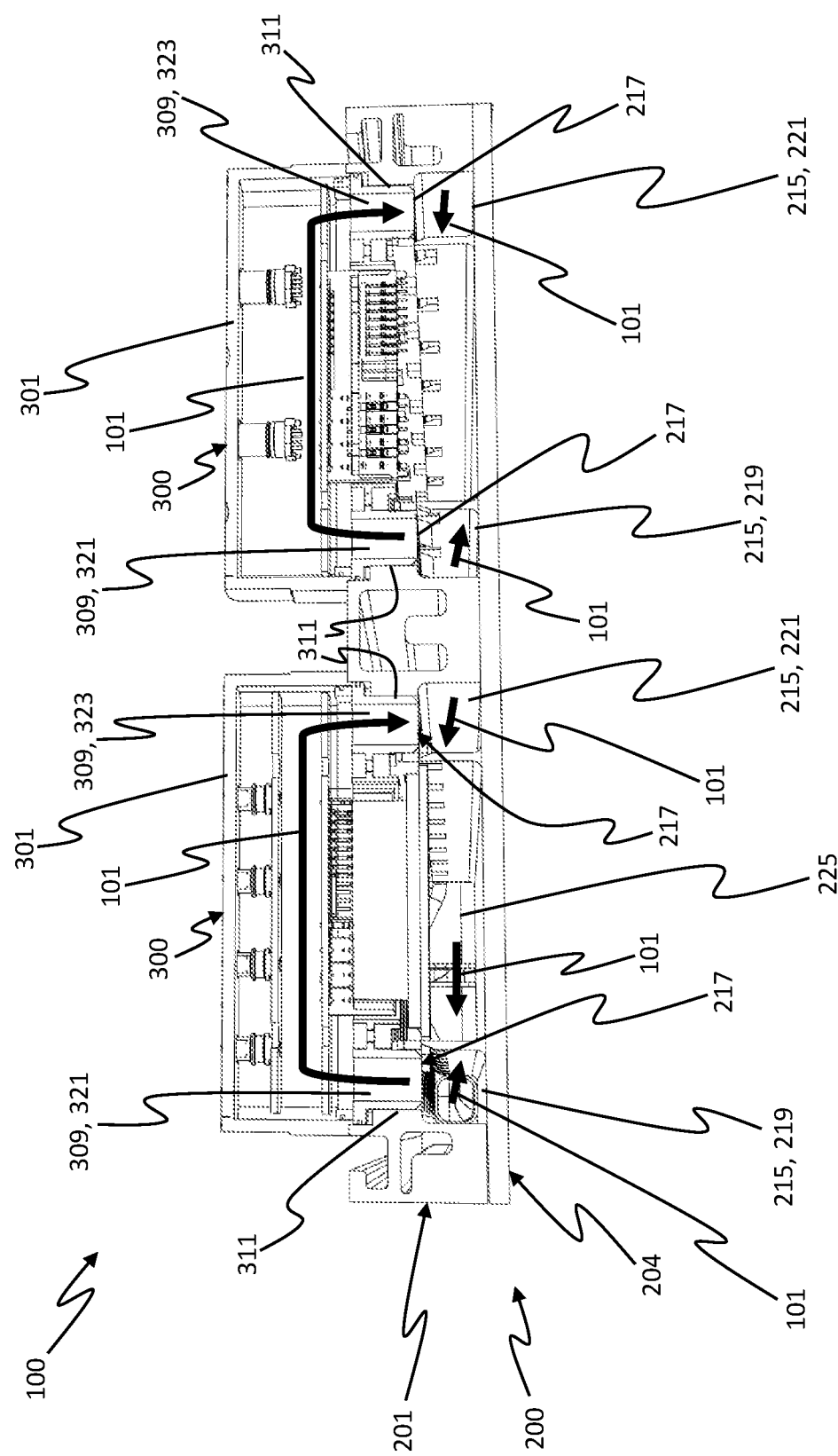
FIG. 9 is a schematic sectional view along a sectional axis A of the control-cabinet system in FIG. 2 according to a further embodiment.

FIG. 9 shows a schematic sectional view along sectional axis A of the control-cabinet system 200 in FIG. 2 according to a further embodiment.

Deviating from the embodiment shown in FIG. 2, FIG. 9 shows two small functional modules 300 which according to FIG. 1 are each connected to only one of the two circulation channels 215 arranged next to each other.

In FIG. 9, the path of a circulating air flow within the circulation circuit 101 is shown for two functional modules 300. The functional modules 300 shown in FIG. 9 differ from the functional modules shown in FIGS. 5 to 8 in that these only have a maximum of two functional connection elements 303 arranged next to each other. Thus, in FIG. 9, each functional module 300 is connected to only one circulation channel 215 of the two side-by-side circulation channels 215 of the base module 200. Each of the functional modules 300 connected to the base module 200 is thus connected exclusively to one circulation channel 215 of the base module 200 and is fluidically connected thereto. The path of a circulating air within the circulation circuit 101, on the other hand, is analogous to the embodiment described with respect to FIG. 8.

Figure 10:
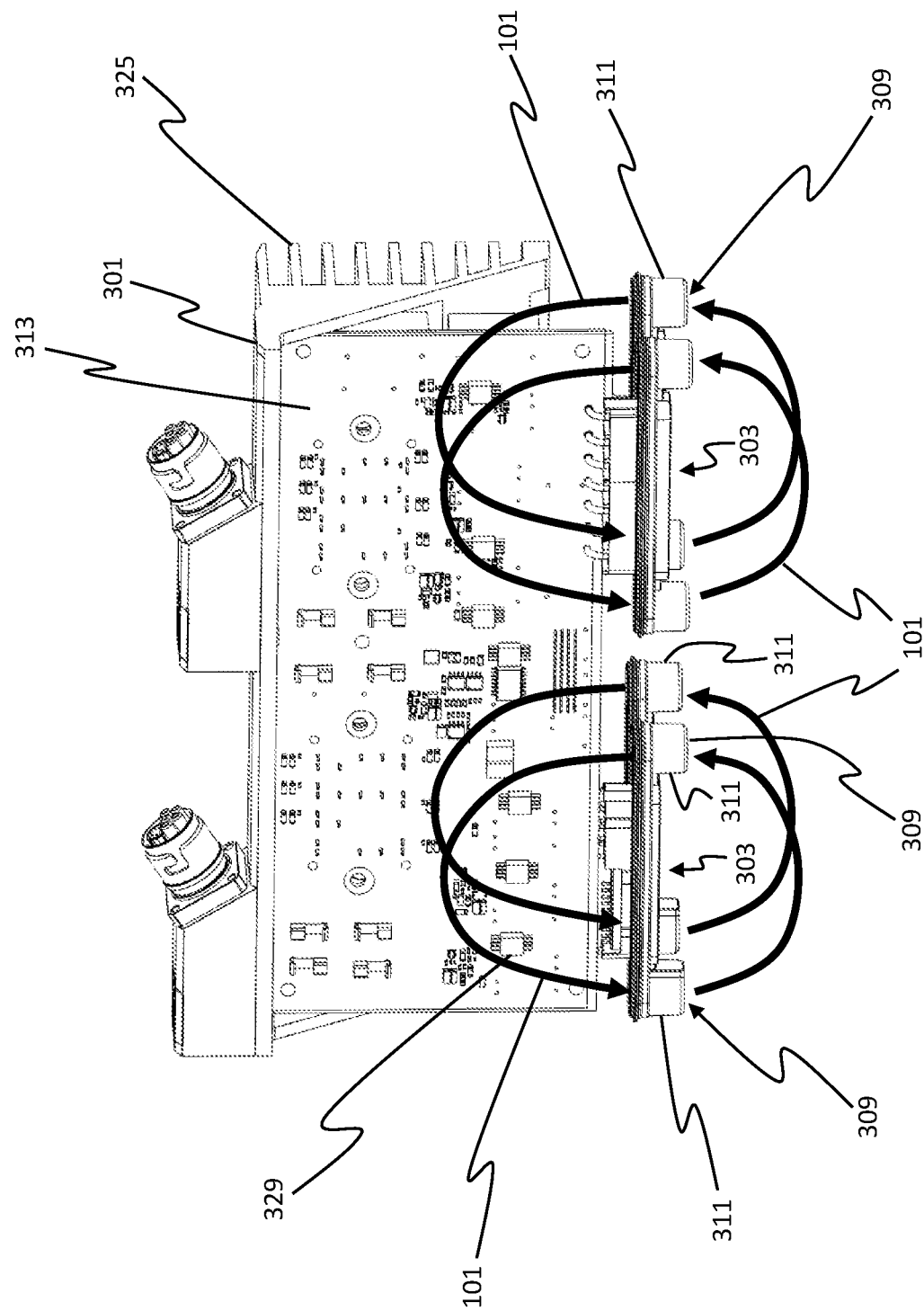
FIG. 10 is a further schematic internal view of the functional module in FIG. 5.

FIG. 10 shows another schematic internal view of the functional module 300 in FIG. 5.

In FIG. 10, the interior of the functional housing 301 of the functional module 300 according to the embodiments in FIGS. 5 to 8 is shown. Furthermore, a possible path of a circulating air flow inside of the functional housing 301 is shown. A corresponding base module 200 is not shown in FIG. 10, so that the path of the circulating air flow within the circulation channel 215 of the respective base module 200 is only schematically indicated (see FIGS. 1-4, 8, 9, 14-16).

In FIG. 10, a circulating airflow is shown entering the interior of the functional housing 301 through coupling openings 309 of the functional connection elements 303 of the functional module 300 and flowing along the electronic functional circuit 313 arranged inside the functional housing 301. This may swirl and disperse any heat pockets that may occur in the area of individual components 329 of the electronic functional circuitry 313. The circulating air flow entering the interior of the functional housing 301 through the coupling openings 309 of the functional connection elements 303 exits the functional housing 301 again through coupling openings 309 of the same functional connection elements 303. This is done analogously to the process described for FIG. 8.

Since the coupling openings 309 of a functional connection element 303 are connected to the same circulation channel 215, e.g. to the first partial channel 219 and the second partial channel 221, and in that pressure differences exist due to the circulation of the air flow, the air flow enters the interior of the functional housing 301 through only one coupling opening 309 of a functional connection element 303 at a time.

Deviating from the path of the circulating air flow within the functional housing 301 shown in FIG. 10, as also shown in FIG. 8, several circulating air flows may mix within the functional housing 301 and thus exit the functional housing 301 again through different second coupling openings 323. As mentioned with respect to FIG. 8, the path of the circulating airflow along the circulation circuit 101 is shown only schematically and an actual path may differ from the paths shown in FIGS. 8 to 10.

Figure 11:
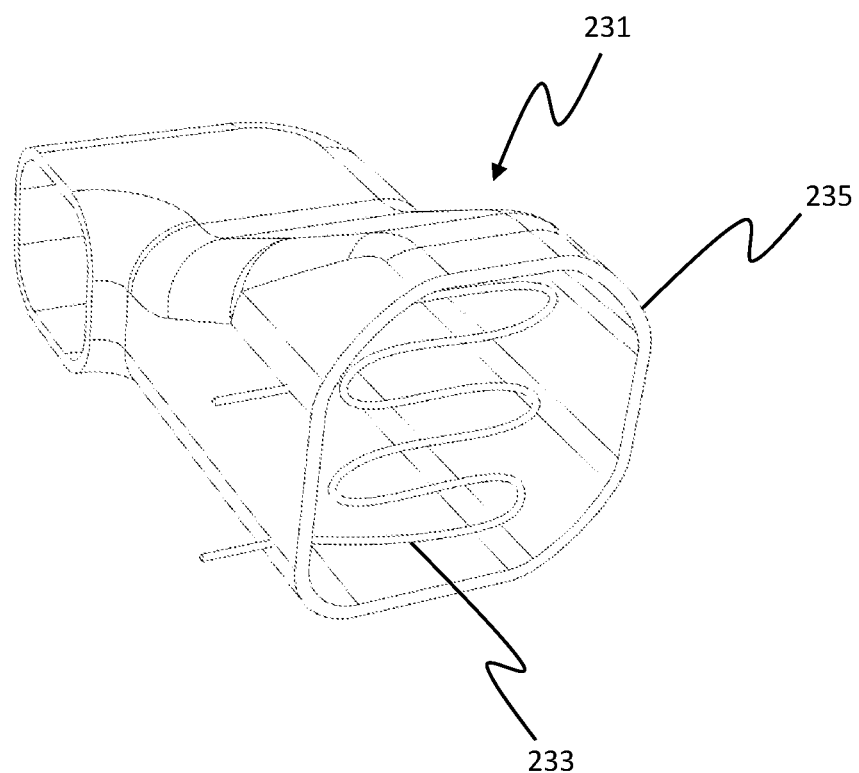
FIG. 11 is a perspective schematic view of a heating element according to an embodiment.

FIG. 11 shows a perspective schematic view of a heating element 231 according to an embodiment.

FIG. 11 shows a heating element 231 that may be used to heat a volume of air within the circulation circuit 101. The heating element 231 in the embodiment shown in FIG. 11 comprises a heating element housing 235 in which a heating wire 233 is arranged. The heating element 231 shown in FIG. 11 operates in accordance with the operation of a hair dryer, in that air to be heated moves through the heating element housing 235 along the heating wire 233 and is thereby heated. As an alternative to the embodiment shown in FIG. 11, the heating element 231 may have a different embodiment.

Figure 12:
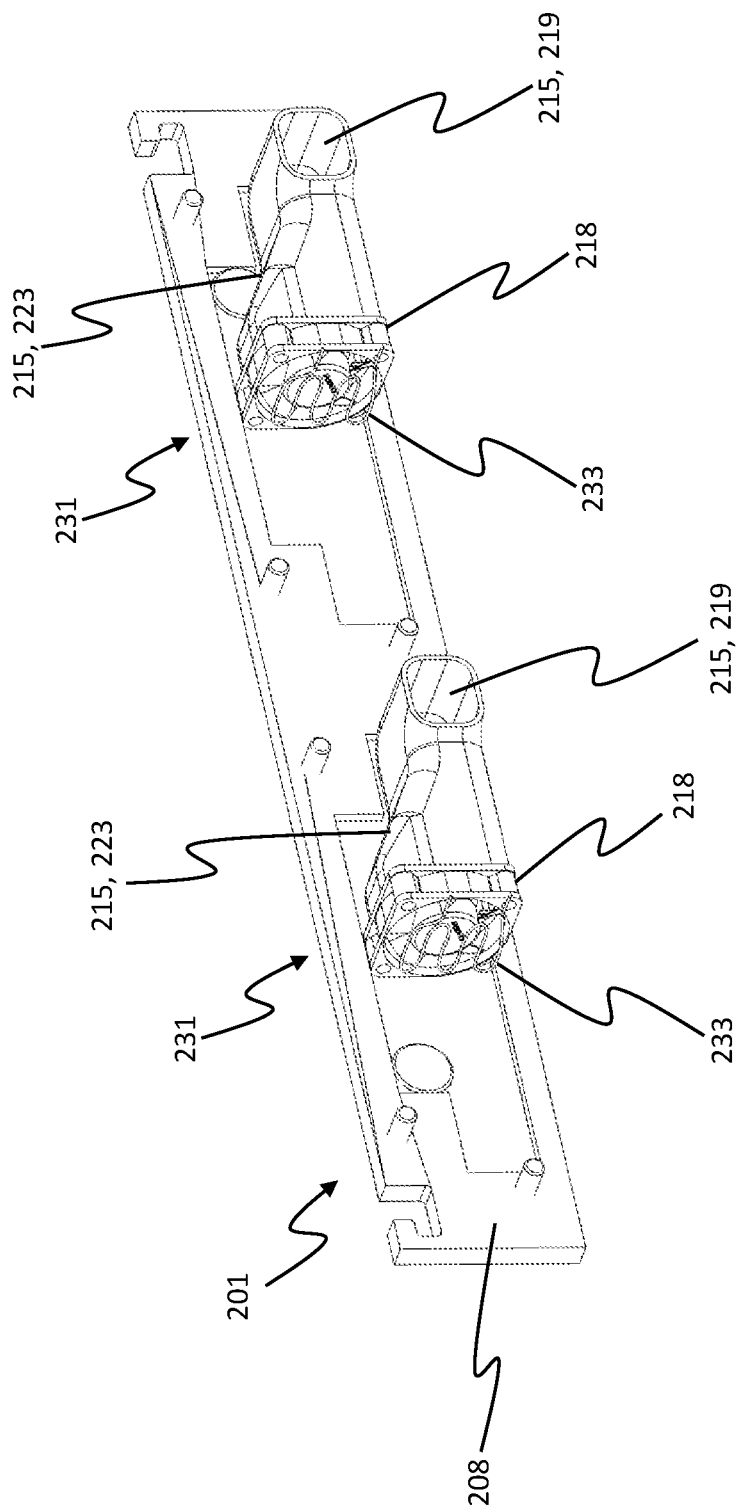
FIG. 12 is a perspective schematic view of the heating element in FIG. 11, wherein the heating element is integrated into a base module.

FIG. 12 shows a perspective schematic view of the heating element 231 in FIG. 11, wherein the heating element 231 is integrated into a base module 200.

In FIG. 12, the heating element 231 is integrated into the third partial channel 223 of the circulation channel 215 of the base module 200. For this purpose, a fourth housing face 208 of the base housing 201 is shown in FIG. 12. Furthermore, for the two juxtaposed third partial channels 323 of the two juxtaposed circulation channels 215 embodied according to the embodiments in FIG. 4 and FIGS. 7 and 8, respectively, only parts of the third partial channels 223 are shown for illustrative purposes. In addition to the heating element 231, which is integrated into the third partial channel 223, a fan element 218 is arranged in each third partial channel 223 according to the embodiment in FIG. 4.

The fan element 218 may thus accelerate the air volume located in the circulation channel 215 and drive it to circulate within the circulation channel 215. The airflow driven to circulate thus flows along the heating wire 233 of the heating element 231, causing heating of the circulating airflow and the volume of air located in the circulation channel 215 or circulation circuit 101.

Figure 13:
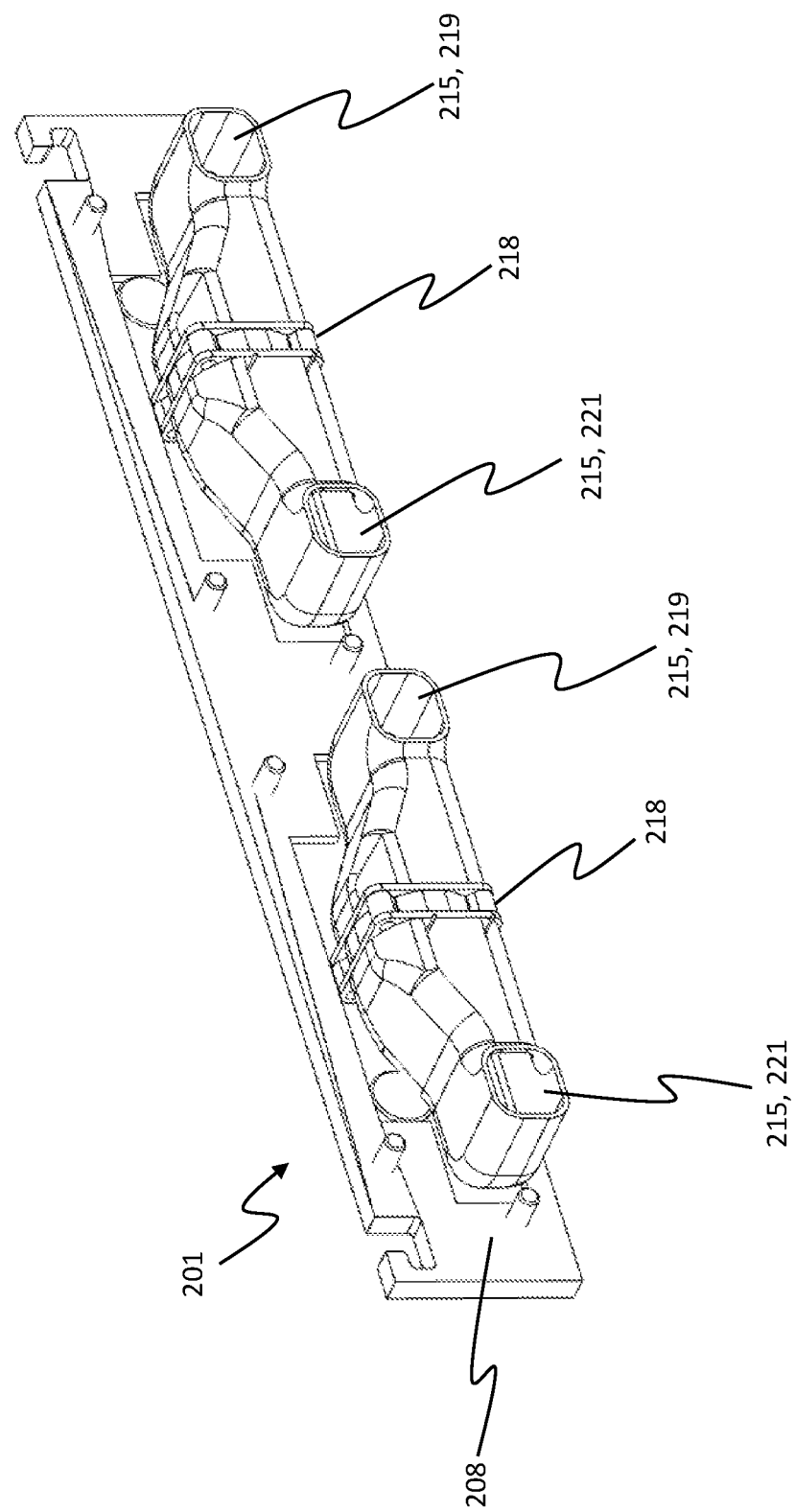
FIG. 13 is a perspective schematic view of the heating element in FIG. 11, wherein the heating element is integrated into a base module.

FIG. 13 shows another perspective schematic view of the heating element 231 in FIG. 11, wherein the heating element 231 is integrated into a base module 200.

FIG. 13 shows the completion of the third partial channels 223 of the circulation channel 215, which are only partially shown in FIG. 12. The fan element 218 as well as the heating element 231 are fully integrated into the respective third partial channels 223.

Figure 14:
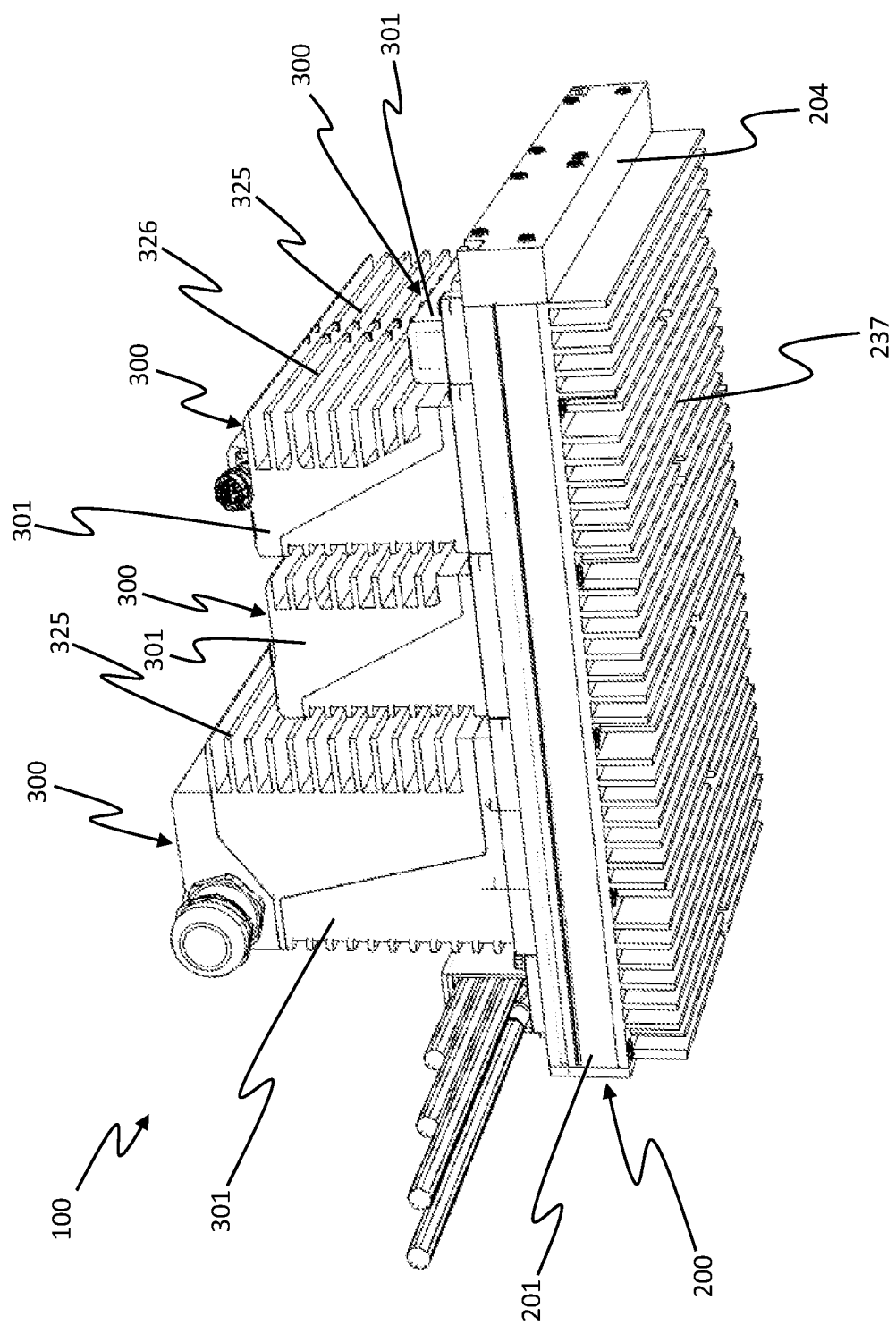
FIG. 14 is a further perspective schematic view of a control-cabinet system according to a further embodiment.

FIG. 14 shows another perspective schematic view of a control-cabinet system 100 according to a further embodiment.

FIG. 14 illustrates an embodiment of the control-cabinet system 100 in which four functional modules 300 are connected to a base module 200. The base module 200 comprises cooling fins 237 at a second housing face 204 of the base housing 201. Cooling of the base housing 201 of the base module 200 may be achieved via the cooling fins 237. Furthermore, three of the functional modules 300 have further cooling fins 325 on a housing surface 326 (FIG. 15) of the functional housing 301. Via the further cooling fins 325, cooling of the functional module 300 may be achieved by increasing a radiation of heat via the functional housing 301 of the functional module 300 to the environment of the control-cabinet system 100 by increasing the respective area of the housing surface 326 through the formation of the further cooling fins 325.

Figure 15:
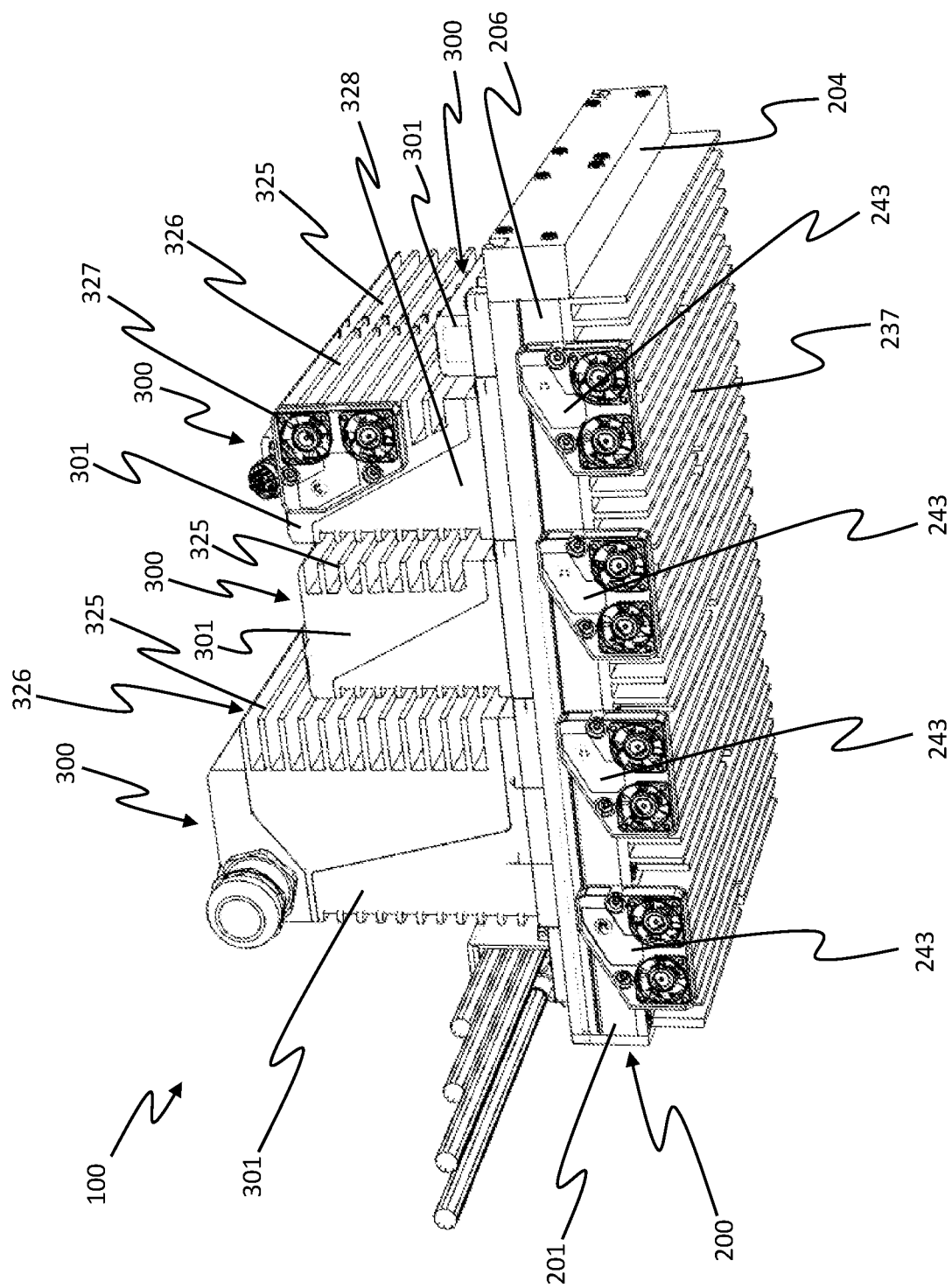
FIG. 15 is a further perspective schematic view of a control-cabinet system according to a further embodiment.

FIG. 15 shows another perspective schematic view of a control-cabinet system 100 according to a further embodiment.

In the embodiment in FIG. 15, external fan elements 243 are further arranged on a third housing face 206 of the base housing 201 of the base module 200, which are configured to guide a cooling air along the cooling fins 237 of the base module 200. In addition, a functional module 300 comprises further external fan elements 327 on a further housing surface 328, which are configured to guide a cooling air along the further cooling fins 325 of the respective functional module 300.

As an alternative to the embodiment shown in FIG. 15, any number of external fan elements 243 may be arranged on the base module 200. In addition, any number of further external fan elements 327 may be arranged on the functional modules 300.

Figure 16:
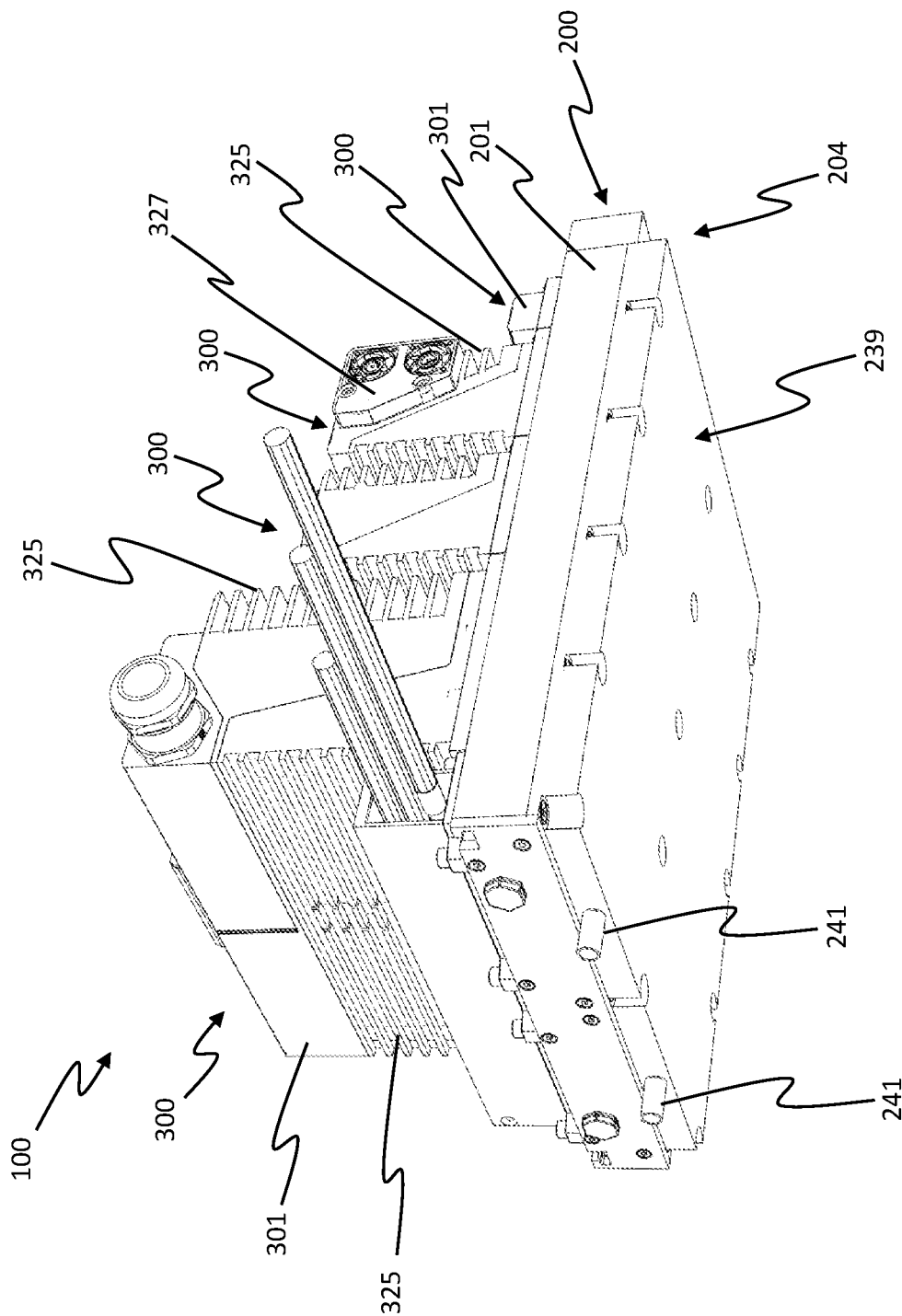
FIG. 16 is a further perspective schematic view of a control-cabinet system according to a further embodiment.

FIG. 16 shows another perspective schematic view of a control-cabinet system 100 according to a further embodiment.

In the embodiment shown in FIG. 16, the base module 200 comprises a water-cooling system 239 on the second housing face 204 instead of cooling fins 237. With the aid of corresponding water supply elements 241, cooling water may be introduced into and discharged from the water-cooling system 239, thereby achieving a cooling effect of the base housing 201 of the base module 200 and, associated therewith, a cooling effect of the air volume located in the base housing 201.

According to a further embodiment, the functional housing 301 of the functional module(s) 300 and/or the base housing 201 of the base module 200 may be made of one material that has a high thermal conductivity of e.g. above 10 W/mK. For example, the functional housing 301 or the base housing 201 may be made of metal, in particular steel, aluminum or a preferred metal alloy with a correspondingly high thermal conductivity. According to an embodiment, the functional housing 301 of the functional module 300 or the base housing 201 of the base module 200 may be coated with a corresponding coating having a high thermal conductivity, in particular higher than 10 W/mK. According to an embodiment, a heat pipe may further be formed in the base module 200, by which a heat sink may be realized relative to the functional modules 300 connected to the base module 200, wherein a heat transport from the functional modules 300 in the direction of the heat sink may be realized within the base module 200. Hereby, a cooling effect of the functional modules 300 may be achieved.

According to another embodiment, the base module 200 may comprise a membrane configured to provide pressure equalization between the volume of air contained within the base housing 201 and the ambient air surrounding the enclosure system 100.

According to an embodiment, passive or closed-loop active cooling with a cooling capacity of up to 100% of the functional modules 300 or the base module 200 of the control-cabinet system 100 may be achieved up to an ambient temperature of 50° C. by the mechanisms described above.

This invention has been described with respect to exemplary examples. It is understood that changes can be made and equivalents can be substituted to adapt these disclosures to different materials and situations, while remaining with the scope of the invention. The invention is thus not limited to the particular examples that are disclosed, but encompasses all the examples that fall within the scope of the claims.

TABLE 1

| | List of reference numerals |
|---|---|
| 100 | control-cabinet system |
| 101 | circulation circuit |
| 200 | base module |
| 201 | base housing |
| 202 | first housing face |
| 203 | base connection elements |
| 204 | second housing face |
| 205 | base voltage connection |
| 206 | third housing face |
| 207 | base data connection |
| 208 | fourth housing face |
| 209 | voltage line |
| 211 | data line |
| 213 | switch-on unit |
| 215 | circulation channel |
| 217 | circulation opening |
| 218 | fan element |
| 219 | first partial channel |
| 221 | second partial channel |
| 223 | third partial channel |
| 225 | fourth partial channel |
| 227 | first circulation opening |
| 229 | second circulation opening |
| 230 | regulating device |
| 231 | heating element |
| 233 | heating wire |
| 235 | heating element housing |
| 236 | heat exchanger |
| 237 | cooling fins |
| 239 | water cooling |
| 241 | water supply element |
| 243 | external fan element |
| 300 | functional module |
| 301 | functional housing |
| 302 | housing underside |

TABLE 1-continued

| | List of reference numerals |
|---|---|
| 303 | functional connection element |
| 305 | voltage connection |
| 307 | data connection |
| 309 | coupling opening |
| 311 | coupling collar |
| 313 | electronic functional circuit |
| 315 | guiding device |
| 316 | guiding nozzle |
| 317 | guiding fan element |
| 319 | guiding channel |
| 321 | first coupling opening |
| 323 | second coupling opening |
| 325 | further cooling fins |
| 326 | housing surface |
| 327 | further external fan element |
| 328 | further housing surface |
| 329 | components of electronic functional circuit |

The invention claimed is:

1. A control-cabinet system having:
a base module, and
at least a functional module,
the base module comprising:
a base housing with a first housing face and a second housing face;
a plurality of base connection elements with base voltage connections and base data connections are arranged on the first housing face,
at least one data line configured as a data bus, the at least one data line having a plurality of switch-on units configured as a subscribers of the data bus, which is connected to the base data connections of the base connection elements via the at least one data line, is arranged in the base housing and at least one voltage line is arranged in the base housing which is connected to the base voltage connections of the base connection elements,
the functional module comprises:
a functional housing with a housing underside, wherein a functional connection element with voltage connections and data connections is arranged on the housing underside,
at least one electronic functional circuit, which is connected to the voltage connections and the data connections of the functional connection element, is arranged in the functional housing,
wherein the functional module is connectable to the base module via a coupling of the functional connection element to one of the base connection elements to achieve a connection of the voltage connections and the data connections of the functional connection element to the base voltage connections and the base data connections of the base connection elements,
wherein a circulation channel is arranged in the base housing for circulating a flow of air in the circulation channel,
wherein each of the base connection elements comprises circulation openings which are fluidically connected to the circulation channel,
wherein the functional connection element has coupling openings fluidically connected to an interior of the functional housing, wherein the coupling openings are coupleable to the circulation openings, and wherein the coupling openings comprises a first coupling opening and a second coupling opening, and wherein, in a coupling of the coupling openings with the circulation openings, a fluidic connection exists between the circulation channel and the interior of the functional housing and a fluidically closed circulation circuit comprising the circulation channel and the interior of the functional housing is formed, in which the flow of the air is circulated by the air entering into the interior of the functional housing from the circulation channel via the first coupling opening and flowing back into the circulation channel from the interior of the functional housing via the second coupling opening.

2. The control-cabinet system according to claim 1, further comprising a fan element, wherein the fan element is integrated into the fluidically closed circulation circuit, and wherein the fan element is configured to accelerate the circulating of the flow of the air within the fluidically closed circulation circuit.

3. The control-cabinet system according to claim 2, wherein the fan element is arranged in the functional housing of the functional module and/or within the circulation channel of the base module.

4. The control-cabinet system according to claim 1, wherein regulating devices are arranged at the circulation openings, wherein the regulating devices are configured to regulate a volume of the flow of the air passing through the circulation openings.

5. The control-cabinet system according to claim 1,
wherein each of the coupling openings comprises a respective coupling collar,
wherein the respective coupling collar surrounds each of the coupling openings and protrudes from the functional connection element,
wherein the respective coupling collar is insertable into a corresponding one of the circulation openings and allows for coupling between each of the coupling openings and the corresponding one of the circulation openings, and
wherein a fluid-tight connection between the functional module and the base module is achieved by the coupling between the coupling openings and corresponding ones of the circulation openings.

6. The control-cabinet system according to claim 1,
wherein sealing devices are arranged at the circulation openings, and
wherein the sealing devices are configured to fluidically seal off the circulation openings of the base connection elements to which no functional modules are connected.

7. The control-cabinet system according to claim 1,
wherein guiding devices are arranged inside of the functional housing of the functional module, and
wherein the guiding devices are configured to guide the flow of the air flowing through the coupling openings into the interior of the functional housing into a predetermined area inside the functional housing, in which at least one component of the electronic functional circuit is arranged.

8. The control-cabinet system according to claim 7, wherein the guiding devices comprise guiding nozzles arranged at the coupling openings and suitable to guide the flow of the air into the predetermined area within the functional housing, and/or wherein the guiding devices comprise a guiding fan element arranged inside of the functional housing.

9. The control-cabinet system according to claim 7,
wherein the guiding devices comprise a guiding channel,
wherein the guiding channel has a fluidic connection to at least one of the coupling openings, and
wherein the guiding channel is configured to guide the flow of the air into a predetermined region within the interior of the functional housing.

10. The control-cabinet system according to claim 1, wherein the circulation channel is in a thermal contact with at least one inner housing wall of the base housing of the base module.

11. The control-cabinet system according to claim 1,
wherein the circulation channel comprises a first partial channel, a second partial channel, a third partial channel and a fourth partial channel,
wherein the first partial channel and the second partial channel are arranged in parallel to each other,
wherein the third partial channel and the fourth partial channel are arranged in parallel to each other,
wherein the circulation openings of each of the base connection elements comprises a first circulation opening and a second circulation opening,
wherein the first circulation opening is fluidically connected to the first partial channel and the second circulation opening is fluidically connected to the second partial channel,
wherein the first coupling opening is coupleable to the first circulation opening and the second coupling opening is coupleable to the second circulation opening, and
wherein a pressure difference is achieved by the circulating of the flow of the air between the first partial channel and the second partial channel generated due to a temperature difference within the functional housing or within the circulation channel or by a fan element.

12. The control-cabinet system according to claim 11,
wherein the first coupling opening and the second coupling opening are arranged at two opposite outermost ends of the functional connection element, and
wherein the data connections and the voltage connections are arranged at the functional connection element between the first coupling opening and the second coupling opening.

13. The control-cabinet system according to claim 1, further comprising a heating element,
wherein the heating element is integrated into the fluidically closed circulation circuit, wherein the heating element is configured to heat a volume of the air comprised by the fluidically closed circulation circuit, and
wherein the heating element is arranged within the functional housing of the functional module and/or within the circulation channel.

14. The control-cabinet system according to claim 1, further comprising a heat exchanger,
wherein the heat exchanger is integrated into the fluidically closed circulation circuit,
wherein the heat exchanger is configured to cool the flow of the air within the fluidically closed circulation circuit,
wherein the heat exchanger is an air-to-air heat exchanger or an air-to-water heat exchanger, and
wherein the heat exchanger is arranged inside of the functional housing of the functional module and/or inside the base housing of the base module.

15. The control-cabinet system according to claim 1,
wherein cooling fins and/or a water-cooling system is configured at the second housing face of the base housing of the base module, and/or
wherein further cooling fins are formed on a housing surface of the functional module.

16. The control-cabinet system according to claim 15,
wherein an external fan element is configured on a third housing surface of the base module, wherein the external fan element is configured to guide cooling air along the cooling fins, and/or
wherein a further external fan element is configured at a further housing surface of the functional module, wherein the further external fan element is set up to guide the cooling air along the further cooling fins.

17. The control-cabinet system according to claim 1,
wherein an internal fan element is arranged in the interior of the functional housing, wherein the internal fan element is configured to guide a portion of the flow of the air along at least one inner wall of the functional housing, and/or
wherein a further internal fan element is arranged in an interior of the base housing, wherein the further internal fan element is configured to guide another portion of the flow of the air along at least one inner housing wall of the base housing.

18. The control-cabinet system according to claim 1,
wherein components of the electronic functional circuit of the functional module comprise a thermal contact to an inner wall of the functional housing,
wherein the functional housing and/or the base housing are made of a material having a thermal conductivity of at least 10 W/mK, and/or
wherein the functional housing and/or the base housing are coated with a coating having a thermal conductivity of at least 10 W/mK.

19. A base module for a control-cabinet system, comprising:
a base housing with a first housing face and a second housing face,
a plurality of base connection elements with base voltage connections and base data connections are arranged on the first housing face,
at least one data line configured as a data bus, the at least one data line having a plurality of switch-on units configured as subscribers of the data bus, which is connected to the base data connections of the base connection elements via the at least one data line, and at least one voltage line, which is connected to the base voltage connections of the base connection elements, are arranged in the base housing,
a circulation channel is arranged in the base housing for circulating a flow of air in the circulation channel,
wherein each of the base connection elements has circulation openings, wherein the circulation openings are fluidically connected to the circulation channel,
wherein the circulation openings are coupleable to coupling openings of a functional connection element of a functional module of the control-cabinet system, wherein the coupling openings are fluidically connected to an interior of a functional housing, and wherein the coupling openings comprise a first coupling opening and a second coupling opening,
wherein the functional module comprises:
the functional housing with a housing underside, wherein the functional connection element with voltage connections and data connections is arranged on the housing underside,
at least one electronic functional circuit, which is connected to the voltage connections and the data connections of the functional connection element, is arranged in the functional housing, and
wherein the functional module is connectable to the base module via a coupling of the functional connection element to one of the base connection elements to achieve a connection of the voltage connections and the data connections of the functional connection element to the base voltage connections and the base data connections of the base connection elements; and
wherein, in a coupling of the circulation openings with the coupling openings of the functional module, a fluidic connection between the circulation channel and the interior of the functional housing is achieved, and
wherein a fluidically closed circulation circuit comprising the circulation channel and the interior of the functional housing is formed, in which the air flow of the air is circulated by the air entering into the interior of the functional housing from the circulation channel via the first coupling opening and flowing back into the circulation channel from the interior of the functional housing via the second coupling opening.

20. A functional module for a control-cabinet system according to claim 1, comprising:
a functional housing with a housing underside,
a functional connection element having voltage connections and data connections is arranged at the housing underside, and
at least an electronic functional circuit arranged in the functional housing, being connected to the voltage connections and the data connections of the functional connection element,
wherein the functional module is connectable to a base module via a coupling of the functional connection element to one of a plurality of base connection elements of the base module of the control-cabinet system, to achieve a connection of the voltage connections and the data connections of the functional connection element to base voltage connections and base data connections of the base connection elements,
wherein the base module comprising:
a base housing with a first housing face and a second housing face, wherein a plurality of base connection elements with the base voltage connections and the base data connections are arranged on the first housing face; and
at least one data line configured as a data bus, the at least one data line having a plurality of switch-on units configured as subscribers of the data bus, which is connected to the base data connections of the base connection elements via the at least one data line, is arranged in the base housing and at least one voltage line is arranged in the base housing which is connected to the base voltage connections of the base connection elements;
a circulation channel arranged in the base housing for circulating a flow of air in the circulation channel,
wherein each of the base connection elements comprises circulation openings which are fluidically connected to the circulation channel;

wherein the functional connection element comprises coupling openings, wherein the coupling openings are fluidically connected to an interior of the functional housing, wherein the coupling openings are coupleable to the circulation openings of the base module of the control-cabinet system, wherein the coupling openings comprise first and second coupling openings, and wherein, in a coupling of the coupling openings having with the circulation openings, a fluidic connection between the circulation channel of the base module and the interior of the functional housing is achieved, and wherein a fluidically closed circulation circuit comprising the circulation channel and the interior of the functional housing is formed, in which the flow of the air is circulated by the air entering into the interior of the functional housing from the circulation channel via the first coupling opening and flowing back into the circulation channel from the interior of the functional housing via the second coupling opening.

* * * * *

UNITED STATES PATENT AND TRADEMARK OFFICE
CERTIFICATE OF CORRECTION

| | |
|---|---|
| PATENT NO. | : 12,245,398 B2 |
| APPLICATION NO. | : 18/150348 |
| DATED | : March 4, 2025 |
| INVENTOR(S) | : Hans Beckhoff, Peter Wittenborg and Daniel Siegenbrink |

It is certified that error appears in the above-identified patent and that said Letters Patent is hereby corrected as shown below:

In the Claims

At Column 26, Line 33 (Claim 1, Line 12):
"units configured as a subscribers of the data bus,"
Should be:
--units configured as subscribers of the data bus,--

At Column 30, Line 31 (Claim 20, Line 2):
"A functional module for a control-cabinet system according to claim 1, comprising:"
Should be:
--A functional module for a control-cabinet system, comprising:--

At Column 31, Line 8 (Claim 20, Line 45):
"in a coupling of the coupling openings having with the circulation openings."
Should be:
--in a coupling of the coupling openings with the circulation openings.--

Signed and Sealed this
First Day of July, 2025

Coke Morgan Stewart
*Acting Director of the United States Patent and Trademark Office*